(12) United States Patent
Onouchi et al.

(10) Patent No.: US 9,030,176 B2
(45) Date of Patent: May 12, 2015

(54) SEMICONDUCTOR INTEGRATED CIRCUIT

(71) Applicant: Renesas Electronics Corporation, Kanagawa (JP)

(72) Inventors: Masafumi Onouchi, Kanagawa (JP); Kazuo Otsuga, Kanagawa (JP); Yasuto Igarashi, Kanagawa (JP); Sadayuki Morita, Kanagawa (JP); Koichiro Ishibashi, Kanagawa (JP); Kazumasa Yanagisawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 218 days.

(21) Appl. No.: 13/674,766

(22) Filed: Nov. 12, 2012

(65) Prior Publication Data
US 2013/0169247 A1    Jul. 4, 2013

(30) Foreign Application Priority Data

Nov. 11, 2011    (JP) .................................. 2011-247215

(51) Int. Cl.
*G05F 1/00*    (2006.01)
*G05F 1/59*    (2006.01)

(52) U.S. Cl.
CPC ........................................ *G05F 1/59* (2013.01)

(58) Field of Classification Search
CPC ............. G05F 1/56; G05F 1/59; G05F 1/565; G05F 1/575; G05F 1/465; G05F 3/24
USPC ........................... 323/265, 268, 269, 273, 274
See application file for complete search history.

(56) References Cited

U.S. PATENT DOCUMENTS

| | | | | |
|---|---|---|---|---|
| 6,191,568 B1* | 2/2001 | Poletti | ........................... | 323/268 |
| 6,614,706 B2* | 9/2003 | Feurle | ........................... | 365/226 |
| 7,135,842 B2* | 11/2006 | Banerjee et al. | ............... | 323/275 |
| 7,208,919 B2* | 4/2007 | May | .............................. | 323/211 |
| 2005/0156581 A1* | 7/2005 | Sutardja et al. | ................ | 323/268 |

OTHER PUBLICATIONS

B.J. Patella, et al. "High-Frequency Digital PWM Controller IC for DC-DC Converters". IEEE Transactions on Power Electronics, vol. 18, No. 1, Jan. 2003.
Y. Okuma, et al. "0.5-V Input Digital LDO with 98.7% Current Efficiency and 2.7 µA Quiescent Current in 65nm CMOS". IEEE. 2010.
L. Guo. "Implementation of Digital PID Controllers for DC-DC Converters using Digital Signal Processors". IEEE EIT Proceedings. 2007.

* cited by examiner

*Primary Examiner* — Matthew Nguyen
*Assistant Examiner* — Kevin H Sprenger
(74) *Attorney, Agent, or Firm* — McDermott Will & Emery LLP

(57) ABSTRACT

A semiconductor integrated circuit includes a plurality of output transistors each controlling the magnitude of an output voltage relative to the magnitude of a load current according to a control value indicated by an impedance control signal applied to a control terminal, a voltage monitor circuit outputting an output voltage monitor value indicating a voltage value of the output voltage, and a control circuit controlling the magnitude of the control value according to the magnitude of an error value between a reference voltage indicating a target value of the output voltage and the output voltage monitor value, and controls based on the control value whether any of such transistors be brought to a conducting state. The control circuit increases a change step of the control value relative to the error value during a predetermined period according to prenotification signals for notifying a change of the load current in advance.

16 Claims, 32 Drawing Sheets

| CONTROL VALUE PL | OUTPUT TRANSISTOR | RESISTANCE VALUE | GATE WIDTH W | DIFFERENCE IN GATE WIDTH BETWEEN LEVELS |
|---|---|---|---|---|
| 1 | PM1 | 100 | 100 | – |
| 2 | PM2 | 90 | 111 | 11 |
| 3 | PM3 | 80 | 125 | 14 |
| 4 | PM4 | 70 | 143 | 18 |
| ⋮ | ⋮ | ⋮ | ⋮ | ⋮ |
| 9 | PM9 | 20 | 500 | 167 |
| 10 | PM10 | 10 | 1000 | 500 |

|  | LOAD CURRENT RANGE | VOLTAGE DROP RANGE OF OUTPUT TRANSISTOR | RESOLUTION OF VOLTAGE DROP | ALLOCATED CONTROL VALUE |
|---|---|---|---|---|
| NORMAL OPERATION | 16 mA TO 250 mA | 15 mV TO 155 mV | 10 mV | 10 TO 59 |
| START-UP OPERATION | 114 μA TO 16 mA | 70 mV TO 120 mV | 50 mV | 1 TO 9 |

| α = 5 | −40 TO 15°C | 15 TO 70°C | 70 TO 125°C |
|---|---|---|---|
| Fast | 8.5 mV | 9.0 mV | 9.5 mV |
| Typcal | 8.0 mV | 8.5 mV | 9.0 mV |
| Slow | 7.5 mV | 8.0 mV | 8.5 mV |

⋮

| α = 8 | −40 TO 15°C | 15 TO 70°C | 70 TO 125°C |
|---|---|---|---|
| Fast | 7.0 mV | 7.5 mV | 8.0 mV |
| Typcal | 6.5 mV | 7.0 mV | 7.5 mV |
| Slow | 6.0 mV | 6.5 mV | 7.0 mV |

| α = 9 | −40 TO 15°C | 15 TO 70°C | 70 TO 125°C |
|---|---|---|---|
| Fast | 6.5 mV | 7.0 mV | 7.5 mV |
| Typcal | 6.0 mV | 6.5 mV | 7.0 mV |
| Slow | 5.5 mV | 6.0 mV | 6.5 mV |

SEMICONDUCTOR INTEGRATED CIRCUIT

CROSS-REFERENCE TO RELATED APPLICATIONS

The disclosure of Japanese Patent Application No. 2011-247215 filed on Nov. 11, 2011 including the specification, drawings and abstract is incorporated herein by reference in its entirety.

BACKGROUND

The present invention relates to a semiconductor integrated circuit equipped with a regulator circuit, and particularly to a regulator circuit which controls an output voltage according to an increase or decrease in load current consumed by a load circuit coupled to an output terminal.

In products each of which utilizes a semiconductor process subsequent to 28 nm-generation, the operation of a semiconductor device has been expected to become faster. A problem, however, arises in that since current density in a chip becomes high as the generation of a semiconductor process proceeds, the voltage to be applied to a transistor is greatly reduced at a high load/high-speed operation as compared with at a low load/low-speed operation, thus resulting in a difficulty of a high-speed operation. Under such a circumstance, there has generally been adopted a method for mounting a regulator circuit over a semiconductor chip and suppressing a fluctuation in the voltage applied to a transistor. In general, analog parts such as a resistor, a capacitor, an inductor, etc. are used in a regulator circuit, and a control algorithm for controlling the voltage by the combination of parameter values for these elements has been implemented. The type of such a regulator circuit is called an analog control type regulator. It is difficult for the analog control type regulator to change the loop characteristics of control according to a target to be controlled, at debug after the manufacture of the chip. This is because it is difficult to greatly change the parameter values for the analog parts for determining the loop characteristics. On the other hand, there has been proposed a digital control type regulator capable of easily changing loop characteristics even after chip design.

An example of a regulator circuit operated by such digital control has been disclosed in each of Non-Patent Documents 1 through 3, for example. There has been disclosed in the Non-Patent Document 1, an example in which a voltage value obtained by monitoring an output voltage is converted to a digital value, and a power MOS transistor is controlled by PID control. There has been disclosed in the Non-Patent Document 2, an example in which the number of power MOS transistors each brought to a conducting state is sequentially increased using shift registers. There has been disclosed in the Non-Patent Document 3, an example in which the gate length of a power MOS transistor is increased along a linear function.

RELATED ART DOCUMENTS

Non-Patent Documents

[Non-Patent Document 1]
B. J. Patella, et. al., "High-Frequency Digital PWM Controller IC for DC-DC Converters", IEEE Transactions on Power Electronics, pp. 438-446, Vol. 18, No. 1, January, 2003.

[Non-Patent Document 2]
Y. Okuma, et al., "0.5-V input digital LDO with 98.7% current efficiency and 2.7-μA quiescent current in 65 nm CMOS," IEEE Custom Integrated Circuits Conference (CICC) 2010, pp. 1-4, 2010.

[Non-Patent Document 3]
L. Guo, "Implementations of Digital PID Controllers for DC-DC Converters using Digital Signal Processors," IEEE INTERNATIONAL CONFERENCE on ELECTRO/INFORMATION TECHNOLOGY 2007. pp. 306-311, May, 2007.

SUMMARY

In a semiconductor device, a module circuit (e.g., a load circuit) is assumed to be a destination to supply an output voltage in a regulator circuit. There has recently been a large demand for a reduction in power consumption. In order to reduce the power consumption, control for taking or assuming a standby mode extremely small in power consumption has often been performed where the module circuit is not utilized.

Therefore, the regulator circuit needs to make adaptation to a large fluctuation in a load current applied to the module circuit. More specifically, the load current applied to the module circuit causes a difference that extends to five digits between a normal operating mode and a standby mode, the regulator circuit needs to maintain constant an output voltage relative to a wide range of load current that ranges from a few μA to a few hundred of mA.

The technologies described in the Non-Patent Documents 1 through 3 are however not capable of suppressing a fluctuation in output voltage relative to a sudden fluctuation in load current. More specifically, since the same control as during another period is performed even during a period in which the load current suddenly fluctuates, the on resistance of each power MOS transistor cannot significantly be changed immediately following the sudden fluctuation in the load current. That is, the technology described in each of the Non-Patent Documents 1 through 3 is accompanied by a problem that when a large fluctuation occurs in the load current, a fluctuation in the output voltage of the regulator circuit cannot be suppressed.

One aspect of a semiconductor integrated circuit according to the present invention includes an output terminal to which a load circuit that consumes a load current is coupled, and from which an output voltage is generated; a plurality of output transistors each having one terminal coupled to a power supply terminal and the other terminal coupled to the output terminal, each output transistor controlling a magnitude of the output voltage corresponding to a magnitude of the load current according to a control value indicated by an impedance control signal supplied to a control terminal thereof; a voltage monitor circuit which monitors the output voltage and outputs an output voltage monitor value indicative of a voltage value of the output voltage; and a control circuit which controls a magnitude of the control value according to a magnitude of an error value between a reference voltage indicative of a target value of the output voltage and the output voltage monitor value and controls based on the control value whether any of the output transistors is brought into a conducting stat. The control circuit increases a change step of the control value relative to the error value during a predetermined period according to prenotification signals for notifying a change of the load current in advance.

In the semiconductor integrated circuit according to the present invention, prenotification signals are received before the load circuit performs a change of an operation mode in which the load circuit increases a load current. A control circuit of a regulator circuit increases a change step of the control value relative to the error value for a predetermined period according to the prenotification signals. Thus, even when a change of an operation mode for the load circuit, in which the load current suddenly increases, has occurred, the regulator circuit according to the present invention is capable of improving the follow-up of an output voltage relative to a fluctuation in load current and suppressing a fluctuation in the output voltage.

According to a semiconductor integrated circuit equipped with a regulator circuit according to the present invention, a fluctuation in the output voltage relative to a sudden fluctuation in load current can be suppressed.

BRIEF DESCRIPTION OF THE DRAWINGS

FIG. 42 is a diagram illustrating one example of table information used in the voltage monitor circuit according to the fourth embodiment.

DETAILED DESCRIPTION

First Embodiment

Figure 1:
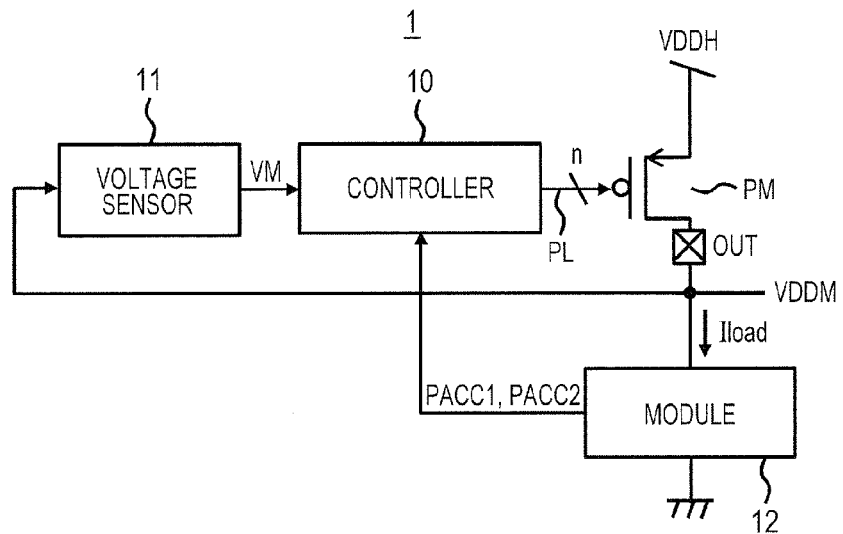
FIG. 1 is a block diagram showing a regulator circuit according to a first embodiment.

Preferred embodiments of the present invention will hereinafter be described with reference to the accompanying drawings. A semiconductor integrated circuit according to the present invention includes a regulator circuit. The regulator circuit has one feature. Thus, the present invention will be explained below centering on the regulator circuit. A block diagram of a regulator circuit 1 according to a first embodiment is first shown in FIG. 1. As shown in FIG. 1, the regulator circuit 1 has an output transistor PM, a control circuit (e.g., a controller 10), a voltage monitor circuit 11 and an output terminal OUT. In the regulator circuit 1, a module 12 is coupled to the output terminal OUT as a load circuit. The regulator circuit 1 generates an output voltage VDDM at the output terminal OUT and supplies the output voltage VDDM to the load circuit (e.g., the module 12). While the module 12 consumes a load current Iload as a consumption current, the regulator circuit 1 performs an operation attempted to maintain the output voltage VDDM at a predetermined voltage regardless of a fluctuation in the load current Iload. Incidentally, the load circuit to which the regulator circuit 1 supplies the load current Iload may be other than the module 12. Although not shown in FIG. 1, the semiconductor integrated circuit has a circuit supplied with power from other than the regulator circuit 1.

In the first embodiment, a PMOS transistor is used as the output transistor PM. The output transistor PM is comprised of a plurality of output transistors. The output transistors respectively have one terminal (e.g., source terminals) each coupled to a power supply terminal (e.g., a power supply terminal for supplying a power supply voltage VDDH) and the other terminals (e.g., drain terminals) each coupled to the output terminal OUT. Each of the output transistors controls the magnitude of the output voltage VDDM corresponding to the magnitude of the load current Iload according to a control value PL indicated by an impedance control signal supplied to a control terminal (e.g., a gate terminal) thereof.

The controller 10 controls the magnitude of the control value PL according to the magnitude of an error value between a reference voltage Vref indicative of a target value of the output voltage VDDM and an output voltage monitor value VM and controls based on the control value PL whether any of the output transistors should be brought to a conducting state. That is, the output transistor PM is configured in such a manner that one output transistor corresponds to one control value.

The voltage monitor circuit 11 monitors the output voltage VDDM and outputs an output voltage monitor value VM indicative of the voltage value of the output voltage VDDM. The output voltage monitor value VM is outputted as a digital value.

In the regulator circuit 1 according to the first embodiment, the module 12 outputs prenotification signals PACC1 and PACC2 before mode switching with a sudden fluctuation in the load current Iload that the module 12 consumes. The controller 10 of the regulator circuit 1 according to the first embodiment increases a change step of the control value relative to an error value for a predetermined period according to the prenotification signals PACC1 and PACC2 for notifying a change of the load current Iload in advance. The operation of the controller 10 will hereinafter be described in detail. Incidentally, the prenotification signal PACC1 is of a signal for notifying the presence or absence of the sudden fluctuation in the load current Iload, and the prenotification signal PACC2 is of a signal indicative of the direction of the fluctuation in the load current Iload. Although the module 12 to be controlled outputs the prenotification signals PACC1 and PACC2 in FIG. 1, a module other than the target for control may output the prenotification signals PACC1 and PACC2.

Figure 2:
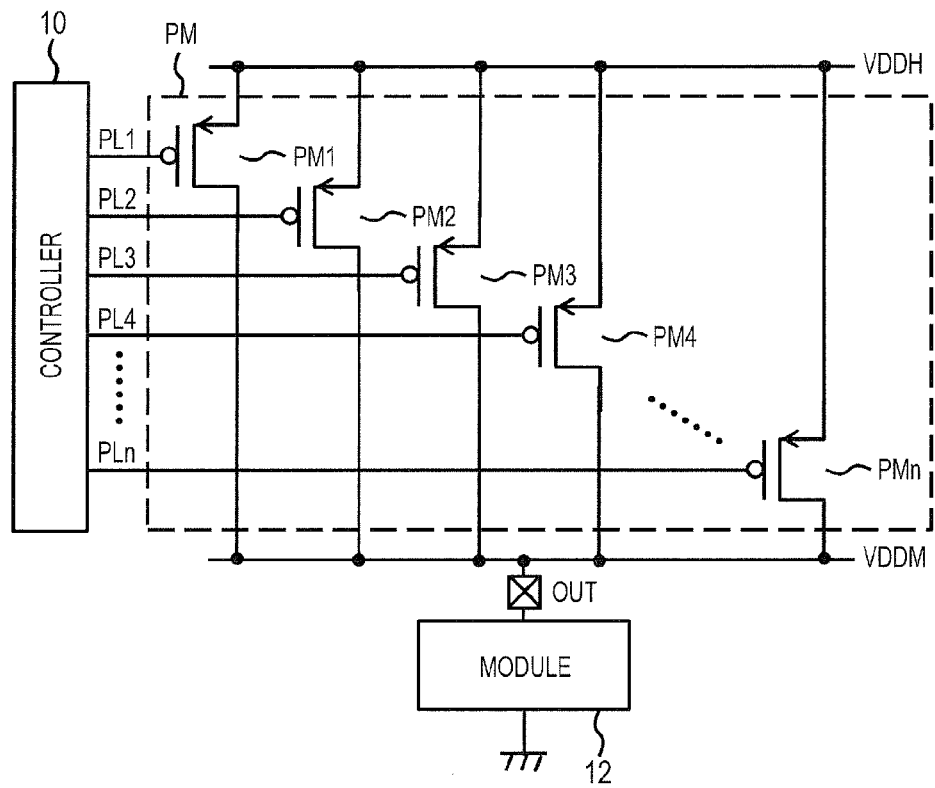
FIG. 2 is a block diagram illustrating the details of an output transistor of the regulator circuit according to the first embodiment.

A description will first be made of the details of the output transistor PM to be controlled by the controller 10. A detailed circuit diagram of the output transistor PM according to the first embodiment is therefore shown in FIG. 2. As shown in FIG. 2, the controller 10 outputs control values PL of n bits (e.g., PMOS level values PL1 through PLn). The output transistor PM has PMOS transistors PM1 through PMn equivalent to the number corresponding to the number of PMOS levels. The PMOS transistors PM1 through PMn respectively have source terminals to which a power supply voltage VDDH is applied, and drain terminals coupled to an output terminal POUT. In the regulator circuit 1 according to the first embodiment, any one of the PMOS levels PL1 through PLn is brought to an enable state (e.g., a low level voltage at which each PMOS transistor is brought to a conducting state) according to the magnitude of the load current Iload. Incidentally, a method of controlling the conducting state of the output transistor PM may be a method of cumulatively increasing the number of the PMOS transistors each brought to the conducting state according to the control value.

Figure 3:
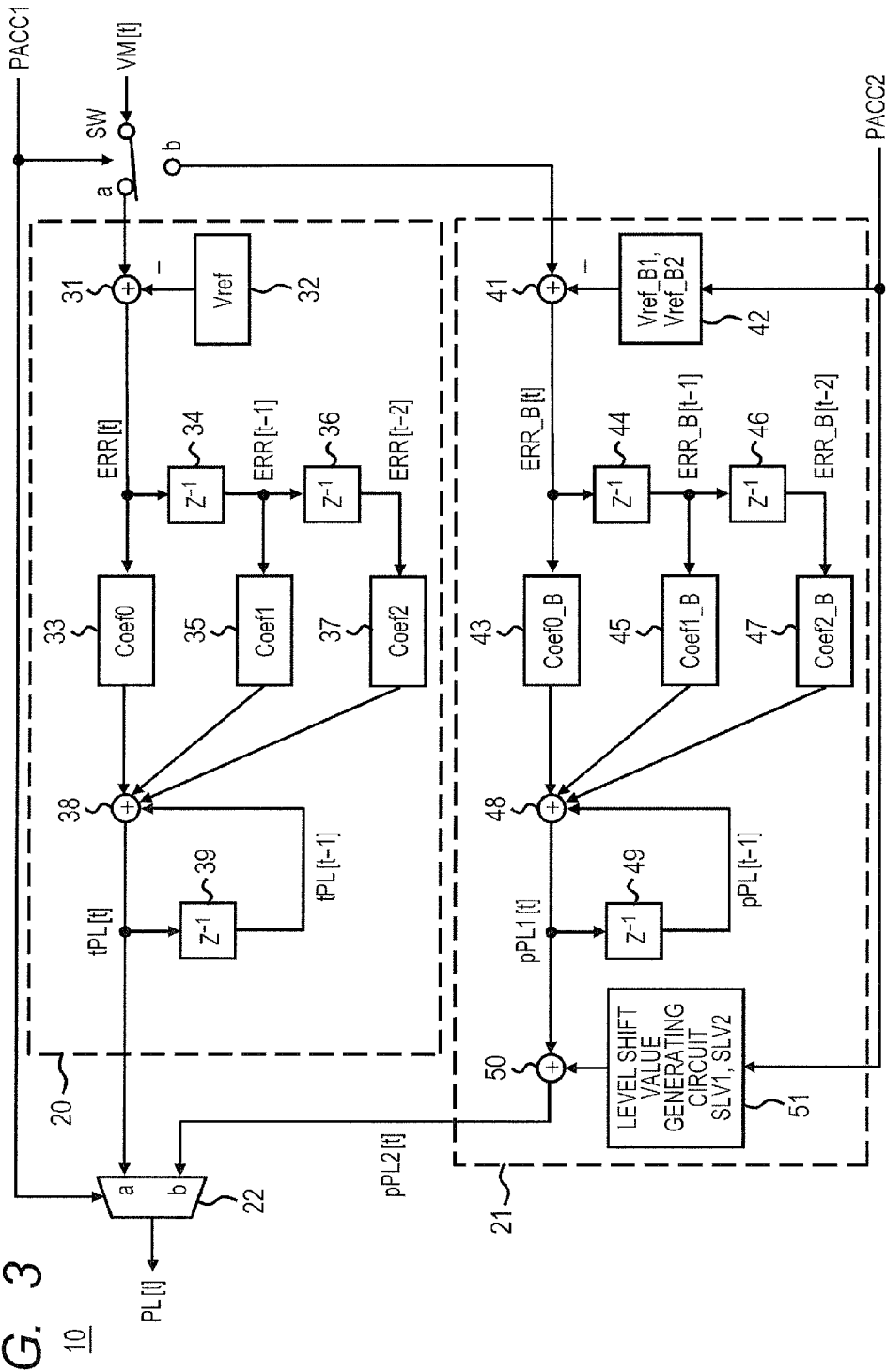
FIG. 3 is a detailed block diagram of a controller of the regulator circuit according to the first embodiment.

Subsequently, the details of the controller 10 of the regulator circuit 1 according to the first embodiment will be explained. A detailed block diagram of the controller 10 is shown in FIG. 3. As shown in FIG. 3, the controller 10 has a switch circuit SW, a first control value generating unit 20, a second control value generating unit 21 and a selector 22. Incidentally, the controller 10 outputs one control value PL every processing cycle repeated in a predetermined period.

The switch circuit SW selects according to the prenotification signal PAAC1 whether the voltage monitor circuit 11 applies an output voltage monitor value VM[t] inputted in the processing cycle t to the first control value generating unit 20 or the second control value generating unit 21. More specifically, when the prenotification signal PACC1 indicates a disenable state (corresponding to a state in which the sudden change in the load current Iload does not occur), the switch circuit SW applies the output voltage monitor value VM[t] to the first control value generating unit 20. When the prenotification signal PACC1 indicates an enable state (corresponding to a normal operating period during which the fluctuation in the load current Iload is small), the switch circuit SW applies the output voltage monitor value VM[t] to the second control value generating unit 21.

When the prenotification signal PACC1 indicates the normal operating period during which the fluctuation in the load current Iload is small, the first control value generating unit 20 generates a control value tPL. When the prenotification signal PACC1 indicates a load sudden change period during which the fluctuation in the load current Iload is large, the second control value generating unit 21 generates a control value pPL2.

When the prenotification signal PACC1 indicates the normal operating period during which the fluctuation in the load current Iload is small, the selector 22 sets the control value tPL generated by the first control value generating unit 20 to a control value PL. When the prenotification signal PACC2 indicates the load sudden change period during which the fluctuation in the load current Iload is large, the selector 22 sets the control value pPL2 generated by the second control value generating unit 21 to the control value PL.

The first and second control value generating units 20 and 21 respectively generate control values according to PID (Proportional, Integral and Derivative) control based on the output voltage and the reference voltage. Thus, the first control value generating unit 20 and the second control value generating unit 21 will be explained in further detail.

The first control value generating unit 20 has adders 31 and 38, a target voltage value generator 32, a first coefficient multiplier 33, delay circuits 34, 36 and 39, a second coefficient multiplier 35 and a third coefficient multiplier 37.

The target voltage value generator 32 generates a reference voltage Vref indicative of a target value of an output voltage VDDM. The adder 31 generates an error value ERR[t] between the reference voltage Vref and the output voltage monitor value VM[t]. The first coefficient multiplier 33 outputs a value obtained by multiplying the error value ERR[t] by a gain coefficient Coef0. The delay circuit 34 outputs an ERR[t−1] obtained by delaying the error value ERR[t] by one processing cycle. The second coefficient multiplier 35 outputs a value obtained by multiplying the error value ERR[t−1] by a gain coefficient Coef1. The delay circuit 36 outputs an ERR[t−2] obtained by delaying the error value ERR[t−1] by one processing cycle. The third coefficient multiplier 37 outputs a value obtained by multiplying the error value ERR[t−2] with a gain coefficient Coef2. The delay circuit 39 outputs a control value tPL[t−1] obtained by delaying the control value tPL[t] by one processing cycle. The adder 38 adds the output value of the first coefficient multiplier 33, the output value of the second coefficient multiplier 35, the output value of the third coefficient multiplier 37 and the output value of the delay circuit 39 to generate a control value tPL[t] in the present processing cycle.

That is, the error value ERR[t] generated at the first control value generating unit 20 becomes a value expressed in the following equation (1). The control value tPL[t] becomes a value expressed in the following equation (2).

$$ERR[t]=VM[t]-Vref \quad (1).$$

$$tPL[t]=Coef0 \times ERR[t]+Coef1 \times ERR[t-1]+Coef2 \times ERR[t-2]+tPL[t-1] \quad (2).$$

The second control value generating unit 21 has adders 41, 48 and 50, a target voltage value generator 42, a first coefficient multiplier 43, delay circuits 44, 46 and 49, a second coefficient multiplier 45, a third coefficient multiplier 47 and a level shift value generating circuit 51.

The garget voltage value generator 42 generates reference voltages Vref_B1 and Vref_B2 each corresponding to a target value of an output voltage VDDM. The target voltage value generator 42 outputs the reference voltage Vref_B1 when the prenotification signal PACC2 indicates that the direction of a fluctuation in the load current Iload is the direction of its increase. The target voltage value generator 42 outputs the reference voltage Vref_B2 when the prenotification signal PACC2 indicates that the direction of the fluctuation in the load current Iload is the direction of its decrease. The reference voltage Vref_B1 is a value higher by ΔV than the reference voltage Vref. The reference voltage Vref_B2 is a value lower by ΔV than the reference voltage Vref.

The adder 41 generates an error value ERR_B[t] between the reference voltage outputted from the target voltage value generator 42 and the output voltage monitor value VM[t]. The first coefficient multiplier 43 outputs a value obtained by multiplying the error value ERR_B[t] by a gain coefficient Coef0_B. The delay circuit 44 outputs an ERR_B[t−1] obtained by delaying the error value ERR_B[t] by one processing cycle. The second coefficient multiplier 45 outputs a value obtained by multiplying the error value ERR_B[t−1] by a gain coefficient Coef1_B. The delay circuit 46 outputs an ERR_B[t−2] obtained by delaying the error value ERR_B[t−1] by one processing cycle. The third coefficient multiplier 47 outputs a value obtained by multiplying the error value ERR_B[t−2] by a gain coefficient Coef2_B. The delay circuit 49 outputs a control value tPL1[t−1] obtained by delaying the control value tPL1[t] by one processing cycle. The adder 48 adds the output value of the first coefficient multiplier 43, the output value of the second coefficient multiplier 45, the output value of the third coefficient multiplier 47 and the output value of the delay circuit 49 to generate a temporary control value tPL1[t] in the present processing cycle.

Incidentally, the gain coefficients Coef0_B, Coef1_B and Coef2_B of the second control value generating unit 21 respectively have values larger than the gain coefficients Coef0, Coef1 and Coef2 of the first control value generating unit 20. The gain coefficients Coef0, Coef1 and Coef2 respectively correspond to a first gain coefficient. The gain coefficients Coef0_B, Coef1_B and Coef2_B respectively correspond to a second gain coefficient.

The adder 50 adds a level shift value outputted from the level shift value generating circuit 51 to the temporary control value pPL1[t] to output a control value pPL2[t]. Here, when the prenotification signal PACC2 indicates that the direction of the fluctuation in the load current Iload is the direction of its increase, the level shift value generating circuit 51 outputs a level shift value SLV1. When the prenotification signal PACC2 indicates that the direction of the fluctuation in the load current Iload is the direction of its decrease, the level shift value generating circuit 51 outputs a level shift value SLV2. The level shift value SLV1 is a value level-shifted in the direction of increasing the temporary control value pPL1[t]. The level shift value SLV2 is a value level-shifted in the direction of decreasing the temporary control value pPL1[t]. Incidentally, the level shift value SLV2 is a positive value and is a value smaller than the level shift value SLV1.

That is, when the prenotification signal PACC2 indicates that the load current Iload increases, the error value ERR_B[t] generated at the second control value generating unit 21 become a value expressed in the following equation (3), and the control value tPL[t] becomes a value expressed in the following equation (4).

$$ERR\_B[t]=VM[t]-Vref\_B1 \quad (4).$$

$$pPL1[t]=Coef0\_B \times ERR\_B[t]+Coef1\_B \times ERR\_B[t-1]+Coef2\_B \times ERR\_B[t-2]+tPL1[t-1]pPL2[t]=pPL1[t]+SLV1 \quad (4)$$

When the prenotification signal PACC2 indicates that the load current Iload decreases, the error value ERR_B[t] generated at the second control value generating unit 21 becomes a value expressed in the following equation (5), and the control value tPL[t] becomes a value expressed in the following equation (6).

$$ERR\_B[t]=VM[t]-Vref\_B2 \qquad (5).$$

$$pPL1[t]=Coef0\_B \times ERR\_B[t]+Coef1\_B \times ERR\_B[t-1]+Coef2\_B \times ERR\_B[t-2]+t$$
$$PL1[t-1]pPL2[t]=pPL1[t]-SLV2 \qquad (6).$$

Figure 4:
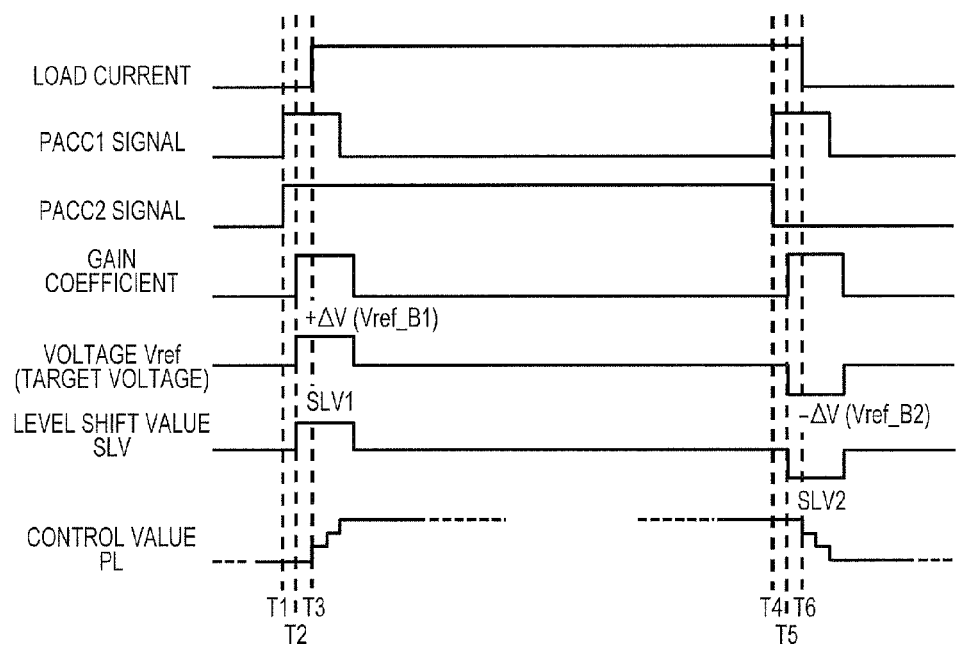
FIG. 4 is a timing chart showing the operation of the regulator circuit according to the first embodiment.

Subsequently, the operation of the regulator circuit 1 according to the first embodiment will be explained. A timing chart showing the operation of the regulator circuit 1 according to the first embodiment is shown in FIG. 4. As shown in FIG. 4, in the regulator circuit 1, the prenotification signals PACC1 and PACC2 are respectively switched from a low level to a high level at a timing T1 prior to a timing T3 at which the load current Iload suddenly increases.

The control value generating unit for generating the control value PL is switched from the first control value generating unit 20 to the second control value generating unit 21 at the timing T2 according to changes in the prenotification signals PACC1 and PACC2. Thus, each gain coefficient used in the generation of the control value increases. In response to the prenotification signal PACC2 being high in level, the target voltage value generator 32 outputs the reference voltage Vref_B1 and the level shift value generating circuit 51 outputs the level shift value SLV1.

The prenotification signal PACC1 is caused to fall after the elapse of a predetermined period from the sudden increase in the load current Iload. The regulator circuit 1 switches the control value generating unit for generating the control value PL from the second control value generating unit 21 to the first control value generating unit 20 according to the change in the prenotification signal PACC1.

In the regulator circuit 1, the prenotification signal PACC1 is switched from the low to high levels at a timing T4 prior to a timing T6 at which the load current Iload suddenly decreases, and the prenotification signal PACC2 is switched from the high to low levels.

The control value generating unit for generating the control value PL is switched from the first control value generating unit 20 to the second control value generating unit 21 at a timing T5 according to the changes in the prenotification signals PACC1 and PACC2. Thus, a gain coefficient used in the generation of the control value becomes large. In response to the prenotification signal PACC2 being low in level, the target voltage value generator 42 outputs a reference voltage Vref_B2, and the level shift value generating circuit 51 outputs a level shift value SLV2.

The prenotification signal PACC1 is caused to fall after a predetermined period has elapsed since the sudden change in the load current Iload. The regulator circuit 1 switches the control value generating unit for generating the control value PL from the second control value generating unit 21 to the second control value generating unit 20 according to the change in the prenotification signal PACC1.

From the above description, the regulator circuit 1 increases a gain coefficient for defining a change step of the control value PL before the timings T3 and T6 at which the load current Iload suddenly changes. Thus, even when the sudden change occurs in the load current Iload, the regulator circuit 1 is capable of improving the follow-up of the control value PL with respect to a fluctuation in the output voltage VDDM and suppressing the fluctuation in the output voltage VDDM.

The regulator circuit 1 increases a reference voltage that becomes a target voltage value, before the timings T3 and T6 at which the load current Iload suddenly changes. Thus, the regulator circuit 1 can change the control value PL in correspondence with the change in the load current Iload before the timings T3 and T6 at which the load current Iload suddenly changes. Changing the control value PL before the load current Iload changes, in this manner makes it possible to change the resistance value of the output transistor PM in such a manner as to correspond to the change in the load current Iload and suppress the fluctuation in the output voltage VDDM relative to the fluctuation in the load current Iload. Incidentally, the change in the reference voltage is a process corresponding to the fact that the change step of the control value PL at the timing prior to the occurrence of the sudden change in the load current Iload is forcibly made large.

The regular circuit 1 adds level shift values SLV1 and SLV2 at which the control value PL is forcibly changed, prior to the timings T3 and T6 at which the load current Iload suddenly changes. That is, the regulator circuit 1 changes the magnitude of the control value PL before the fluctuation in the output voltage VDDM with the fluctuation in the load current Iload occurs. Thus, the fluctuation in the output voltage VDDM at the start of the change in the load current Iload can be suppressed by forcibly changing the control value PL before the load current Iload suddenly changes. Incidentally, the addition of the level shift values is a process equivalent to the fact that the change step of the control value PL at the timing prior to the occurrence of the sudden change in the load current Iload is forcibly made large.

The regulator circuit 1 changes control parameters (e.g., gain coefficients, reference voltages and level shift values) based on the prenotification signals to thereby make it possible to follow the sudden change in the load current Iload with ease. Following updating of the control value PL with satisfactory accuracy in response to the sudden increase in the load current Iload makes it possible to prevent the control value PL from overshooting. An overshoot of the output voltage VDDM can also be prevented by preventing the control value PL from overshooting.

Incidentally, although the three parameters used in each control value generating unit have all been changed according to the prenotification signal in the above embodiment, the fluctuation in the output voltage VDDM can be suppressed even only when one of the three parameters is changed according to the prenotification signal.

The operation of a related art regulator circuit which does not perform changes of control parameters (e.g., gain coefficients, reference voltages and level shift values) based on the prenotification signal will be explained as a comparative example. A timing chart showing the operation of the related art regulator circuit is shown in FIG. 5.

Figure 5:
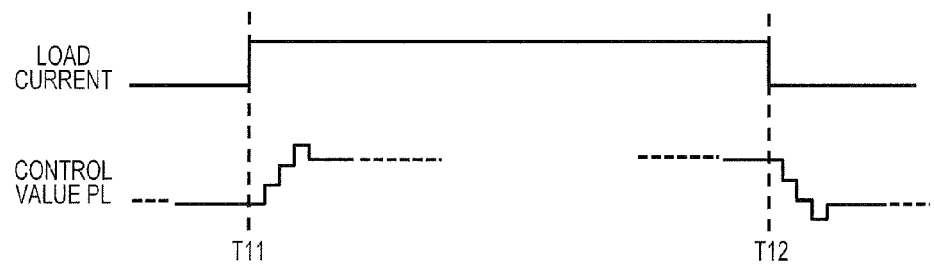
FIG. 5 is a timing chart showing the operation of a related art regulator circuit.

As shown in FIG. 5, in the related art regulator circuit, the updating of a control value PL is started after the occurrence of a sudden fluctuation in the load current Iload (e.g., after timings T11 and T12). In the related art regulator circuit, a step for the updating of the control value PL is constant during the whole period. Therefore, in the related art regulator circuit, the control value PL is not capable of sufficiently following a change in output voltage VDDM, so that an overshoot of the control value PL occurs. Since the control value PL is not capable of sufficiently following the fluctuation in the output voltage VDDM, its fluctuation becomes large.

Figure 6:
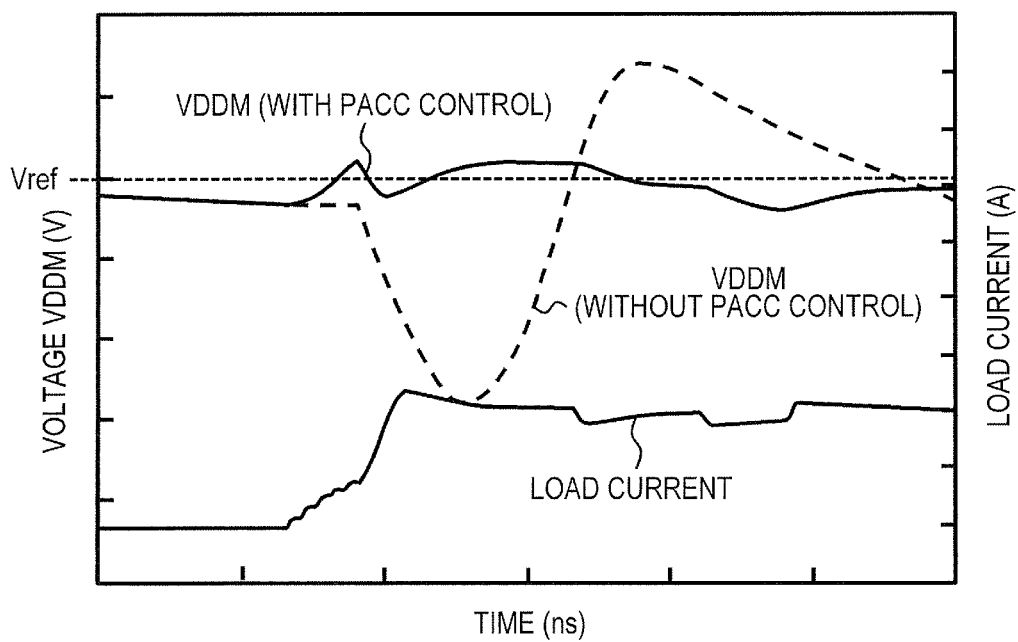
FIG. 6 is a graph for comparing a fluctuation in output voltage in the regulator circuit according to the first embodiment and a fluctuation in output voltage of the related art regulator circuit.

Thus, graphs showing fluctuations in the output voltage outputted from the regulator circuit 1 according to the first embodiment and the output voltage outputted from the related art regulator circuit where the load current Iload suddenly increases are shown in FIG. 6.

As shown in FIG. 6, the output voltage VDDM generated from the regulator circuit 1 according to the first embodiment starts a rise in voltage before the load current Iload suddenly increases. A voltage drop at the timing at which the sudden increase in the load current Iload has occurred is also suppressed low. On the other hand, the output voltage VDDM outputted from the related art regulator circuit is reduced greatly according to the sudden increase in the load current Iload and converges to a stable voltage with a large overshoot.

Thus, the use of the regulator circuit 1 according to the first embodiment makes it possible to stably maintain the output voltage VDDM even when the load current Iload changes greatly. Improving the stability of the output voltage VDDM in this manner makes it possible to prevent an excessive voltage from being applied to the module 12 and enhance the reliability of the module 12. Since the overshoot or undershoot of the output voltage VDDM is suppressed small, it is possible to set a fluctuation margin of the output voltage VDDM to be small and set a higher voltage to the output voltage VDDM. Setting the output voltage VDDM high enables an improvement in operating speed of the module 12.

Second Embodiment

A second embodiment will explain a method of setting the gate width of an output transistor. A description will first be made of a method of setting the gate width of a general output transistor. Thus, graphs indicative of a relationship between the gate width of a related art output transistor and the magnitude of a control value PL, and a relationship between the magnitude of an output voltage VDDM and the magnitude of a control value PL are shown in FIG. 7.

Figure 7:
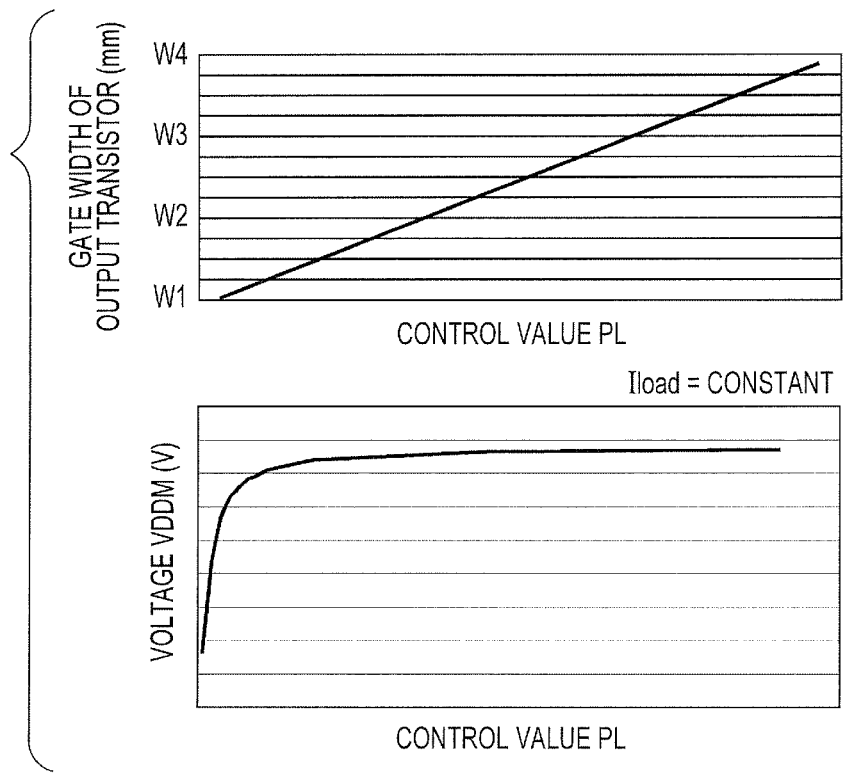
FIG. 7 is a graph showing a method of setting a gate width of a related art output transistor.

As shown in FIG. 7, in the method of setting the gate width of the general output transistor, the gate width of the output transistor is set in such a manner that the gate width linearly increases with respect to the magnitude of the control value PL. When the gate width is set in such a manner as to change linearly with respect to the control value PL, the output voltage VDDM rises in a relationship inversely proportional to the control value PL. That is, the output voltage VDDM reaches a sufficient voltage before the control value PL becomes sufficiently large, and thereafter changes so as to be asymptotic to a target voltage. Incidentally, the example illustrated in FIG. 7 has shown a change in the output voltage VDDM where a load current Iload is constant.

Now, when the load current is assumed to be Iload, and the on resistance of an output transistor PM is assumed to be Ron, the output voltage VDDM is expressed in VDDM=VDDH× Ron×Iload. When the gate width of the output transistor PM is W, its on resistance Ron has a relationship of Ron∝1/W. With this situation, when the gate width is set to become linearly associated with the control value PL, the output voltage VDDM becomes such a characteristic as shown in FIG. 7.

Thus, when a change in the resistance value of the output transistor is put in a relationship nonlinear to the control value PL, a change in the output voltage VDDM that changes with the updating of the control value PL becomes excessively large or excessively small. That is, when the gate width setting method known up to now is adopted, there are problems in that the follow-up of the control value PL with respect to the output voltage VDDM is deteriorated, and controllability of the output voltage VDDM is degraded.

When a change in the gate width of the output transistor with respect to the control value PL is set linearly, a problem arises in that the number of PMOS transistors that configure the output transistor, and the number of control values PL increase. A relationship between each control value PL and the on resistance Ron of an output transistor is therefore shown in FIG. 8 to explain this problem.

Figures 8, 9:
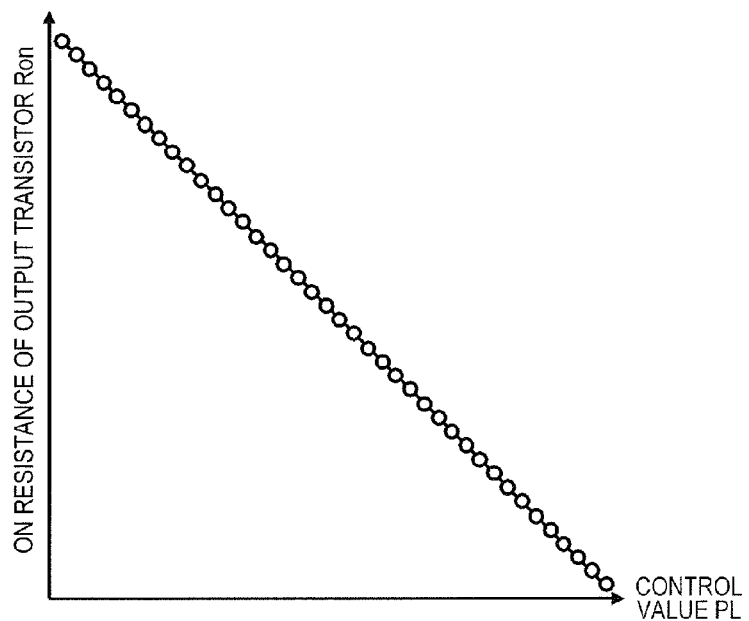
FIG. 8 is a graph for describing the on resistance of an output transistor based on a related art gate width setting method, and the number of PMOS levels.
FIG. 9 is a table showing one example of the relationship between a set value of a gate width of an output transistor in a regulator circuit according to a second embodiment and a PMOS level.

When a fluctuation in the output voltage VDDM is assumed to fall within a predetermined range, it is necessary to set a fluctuation in the output voltage VDDM in a region largest in load current Iload to within a predetermined range. When the fluctuation in the output voltage VDDM is suppressed with respect to such a large current fluctuation, it is necessary to make smaller a difference in on resistance developed at one change step. That is, the on resistance is needed to be switched at a small change step overt the full range of the control values PL. With this point of view, when the gate width of the output transistor is set linearly with respect to each control value PL as shown in FIG. 8, it is necessary to switch the gate width of the output transistor at very fine steps and thereby control its on resistance. Thus, when the control values PL are changed in the fine steps, a problem arises in that the number of the PMOS transistors that configure the output transistor PM, and a circuit scale of a control value generating circuit increase.

Thus, in a regulator circuit according to the second embodiment, the gate width of the output transistor PM is changed linearly with respect to each control value PL. In the regulator circuit according to the second embodiment as well, the resistance value of the output transistor PM is changed linearly with respect to each control value PL. Thus, one example in which the gate width of the output transistor PM in the regulator circuit according to the second embodiment is set, is shown in FIG. 9.

In the example shown in FIG. 9, the number of the PMOS transistors that configure the output transistor PM shown in FIG. 2 has been set to ten. In the regulator circuit according to the second embodiment, as shown in FIG. 9, one PMOS transistor is provided corresponding to one control value PL. As the corresponding control value PL becomes larger, the resistance value of each PMOS transistor is reduced linearly. As the corresponding control value PL becomes larger, the gate width of each PMS transistor becomes large, but its change becomes nonlinear. More specifically, the larger the control value PL, the greater the difference in gate width due to the difference between the control values PL.

Figure 10:
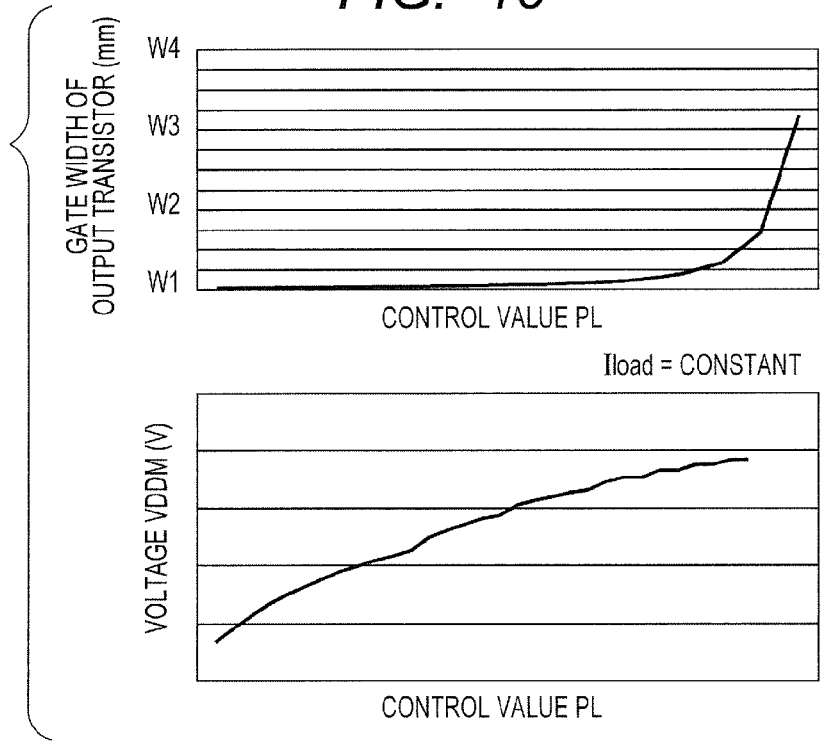
FIG. 10 is a graph showing a method of setting the gate width of the output transistor in the regulator circuit according to the second embodiment.

Now, there are shown in FIG. 10, graphs indicating a relationship between the gate width of the output transistor and the magnitude of the control value PL in the regular circuit according to the second embodiment, and a relationship between the magnitude of the output voltage VDDM and the magnitude of the control value PL. As shown in FIG. 10, in the regulator circuit according to the second embodiment, the gate width of the output transistor becomes large in inverse proportion to each control value PL. On the other hand, in the regulator circuit according to the second embodiment, the output voltage VDDM rises in a relationship approximately linear to the control value PL. In the example shown in FIG. 10, a load current Iload is held constant. That is, in the regulator circuit according to the second embodiment, the on resistance Ron of the output transistor changes in a relationship linear to the control value PL.

Changing the on resistance Ron of the output transistor in the relationship linear to each control value PL in this way enables a reduction in the number of the control values PL. A description will therefore be made below of the reason why the number of the control values PL can be suppressed.

Figure 11:
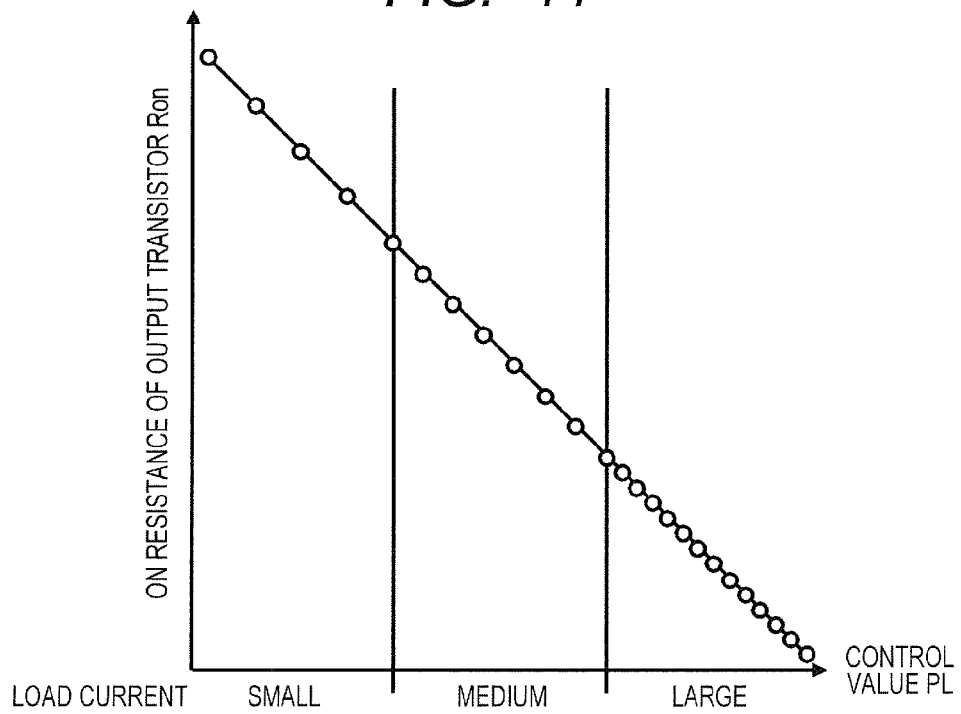
FIG. 11 is a graph for describing the gate width of the output transistor in the regular circuit according to the second embodiment and the number of PMOS levels.

A relationship between each control value PL and the on resistance Ron of the output transistor in the regulator circuit according to the second embodiment is shown in FIG. 11. In the regulator circuit according to the second embodiment, the magnitude of each control value PL is set corresponding to the magnitude of a load current Iload. More specifically, a control value PL that is a small value is associated with a small load current Iload, whereas a control value PL that is a large value is associated with a large load current Iload.

Now, a fluctuation width allowable for the output voltage VDDM where the load current is of a small load current Iload, and a fluctuation width allowable for the output voltage VDDM where the load current is of a large load current Iload are set identical to each other. The allowable fluctuation width of the output voltage VDDM where the load current Iload is 0.25 mA is assumed to be 10 mV, the on resistance Ron is allowed up to 40Ω. On the other hand, when the allowable fluctuation width of the output voltage VDDM where the load current Iload is 250 mA, is assumed to be 10 mV, the on resistance Ron is allowed up to 40 mΩ.

That is, in a region in which the load current Iload is 0.25 mA or below, the on resistance Ron is needed not to be switched at a change step of 40 mΩ as with when the load current Iload is large. With this point of view, in a range in which the load current Iload is small, a change in the resistance value of the on resistance Ron at the time that the control value PL is changed by one can be made large.

On the other hand, when the load current is large, it is not possible to satisfy the allowable fluctuation width of the output voltage VDDM if the on resistance Ron is not switched at a small change step. It is therefore necessary to reduce a change in the resistance value of the on resistance Ron when the control value PL is changed by one, in a range in which the load current Iload is large.

For such a reason as described above, there is shown in the example shown in FIG. 11, a graph in which the change step of the on resistance Ron is the largest in a range in which the load current is small, and the change step of the on resistance Ron becomes small as the load current becomes larger. Changing the change step of the on resistance Ron according to the magnitude of the load current Iload in this way makes it possible to reduce the number of switching of the on resistance Ron. Since the number of values available for the control values PL corresponds to the number of switching of the on resistance Ron, the number of the control values PL can be reduced.

Figures 12, 13:
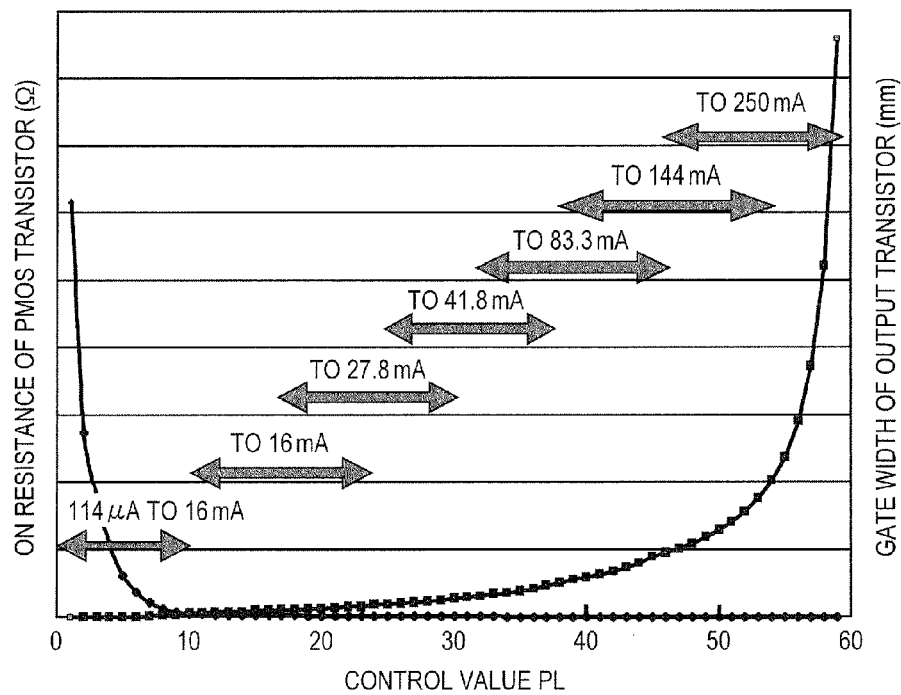
FIG. 12 is a table showing one example of the relationship between the number of PMOS levels and a voltage drop range in the regulator circuit according to the second embodiment.
FIG. 13 is a graph showing the relationship between a load current range and PMOS levels in the regulator circuit according to the second embodiment.

An example of setting the regulator circuit according to the second embodiment will now be explained as a concrete example. As illustrated in FIG. 12, a table showing the number of control values PL in the regulator circuit according to the second embodiment is shown in FIG. 12. In the regular circuit according to the second embodiment, a voltage drop range allowable for the output transistor is changed during a start-up operation and a normal operation. Therefore, two settings are shown in Table shown in FIG. 12.

As shown in FIG. 12, the regulator circuit according to the second embodiment is capable of adapting to a fluctuation range of a load current from 114 μm to 250 mA by control values PL of fifty-nine stages. More specifically, the regulator circuit according to the second embodiment makes adaptation to fluctuations in load current, having a difference of about 2200 times, using only the number of change steps corresponding to fifty-nine stages.

In the example shown in FIG. 12, the regulator circuit according to the second embodiment indicates fluctuations in load current from 114 μm to 16 mA during the start-up operation. The regulator circuit according to the second embodiment changes the control value PL at nine stages of 1 to 9 to set the voltage drop of the output transistor to 70 mV to 120 mV and set the resolution of the voltage drop to 50 mV. The regulator circuit according to the second embodiment indicates fluctuations in load current from 16 mA to 250 mA during the normal operation. The regulator circuit according to the second embodiment changes the control value PL at fifty stages of 10 to 59 to set the voltage drop of the output transistor to 15 mV to 155 mV and set the resolution of the voltage drop to 10 mV.

The operation range shown in FIG. 12 will now be explained in a concrete manner. There is thus shown in FIG. 13, a graph showing a relationship between each control value PL and a load current range, a relationship between the control value PL and the resistance value of an output transistor, and a relationship between the control value PL and the gate width of the output transistor in the regulator circuit according to the second embodiment.

As shown in FIG. 13, in the regulator circuit according to the second embodiment, prescribed control values PL are adapted according to the range of the load current Iload. As shown in FIG. 13, in the second embodiment, the on resistance of the output transistor is set so as to decrease in a proportional relationship at a specific Iload with respect to each control value PL, and the gate width of the output transistor is set so as to rise in an inverse proportional relationship.

From the above description, the regulator circuit according to the second embodiment has features that it includes an output terminal to which a load circuit that consumes a load current is coupled and from which an output voltage is generated, a plurality of output transistors each of which has terminals one of which is coupled to a power supply terminal and the other of which is coupled to the output terminal and controls the magnitude of the output voltage relative to the magnitude of the load current according to a control value indicated by an impedance control signal supplied to a control terminal, a voltage monitor circuit which monitors the output voltage and outputs an output voltage monitor value indicative of the value of the output voltage, and a control circuit which controls the magnitude of the control value according to the magnitude of an error value between a reference voltage indicative of a target value of the output voltage and the output voltage monitor value and controls based on the control value whether any of the output transistors should be brought into a conducting state, and that the gate widths of a plurality of PMOS transistors that configure an output transistor are set so as to increase in a relationship inversely proportional to the magnitude of the control value.

In the regulator circuit according to the second embodiment, the inverse number of the gate width of each output transistor is set so as to decrease in a relationship proportional to each control value PL. Setting the change step of the gate width of the output transistor in this way makes it possible to change the on resistance of the output transistor in a relationship linear to the control value PL. Thus, the on resistance of the output transistor is changed in the relationship linear to the control value PL, thereby making it possible to linearly set a fluctuation in the output voltage VDDM where the controller 10 has updated the value indicative of the control value PL. That is, in the regulator circuit according to the second embodiment, the change characteristic of the output voltage VDDM and the change characteristic of the control value PL can both be made linear. In the regulator circuit according to the second embodiment, the follow-up of the control value PL to the change in the output voltage VDDM can be improved, and higher-accurate control on the output voltage VDDM can be performed.

In the regulator circuit according to the second embodiment, the setting of the gate width of each output transistor is set nonlinear to each control value PL, thereby enabling higher-accurate control on the output voltage VDDM by a small number of set values PL. It is thus possible to reduce the number of circuit elements that configure the controller 10 and cut down its circuit area. Since the number of the PMOS transistors that configure the output transistor PM can also be reduced, a circuit area about the output transistor PM can be cut down.

Third Embodiment

It is necessary to supply a higher voltage to a module 12 with a view toward making faster the operation of the module 12. When the module 12 is supplied with a high-voltage power supply through a regulator circuit, it is necessary to apply a voltage higher than the power supply supplied to the module 12 to the regulator circuit in consideration of a voltage drop developed in the regulator circuit.

When, however, the power supply voltage higher than the voltage supplied to the module 12 is applied to the regulator circuit, high-voltage elements each having a breakdown voltage higher than at the module 12 must be used as elements that configure the regulator circuit. The high-voltage elements are larger in transistor area than low-voltage elements. A problem therefore arises in that when the regular circuit is configured using the high-voltage elements, the area of the regulator circuit becomes large.

Thus, the third embodiment will explain a regulator circuit 2 comprised of low-voltage elements each having the same breakdown voltage as the module 12. A block diagram of the regulator circuit 2 according to the third embodiment is shown in FIG. 14.

Figure 14:
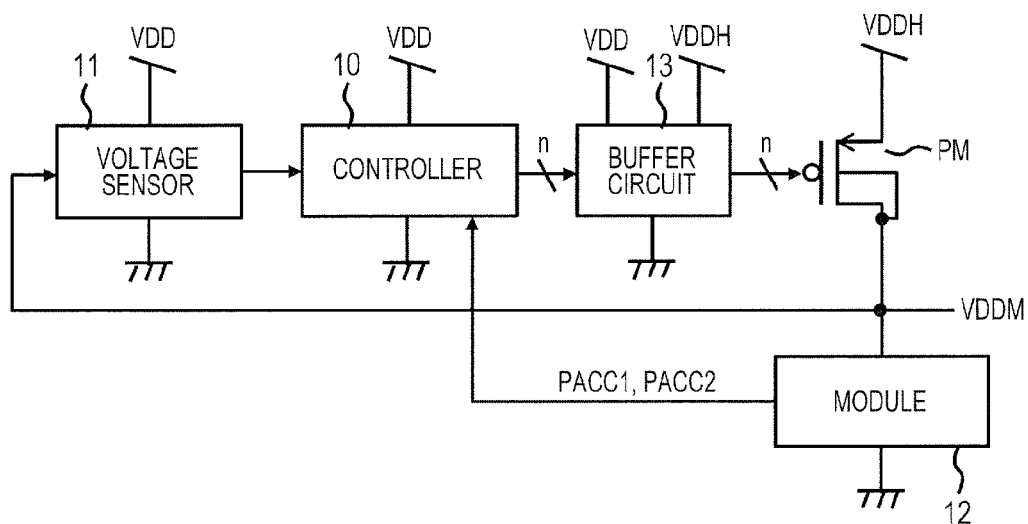
FIG. 14 is a block diagram of a regulator circuit according to a third embodiment.

As shown in FIG. 14, the regulator circuit 2 cording to the third embodiment has a controller 10, a voltage monitor circuit 11, a buffer circuit 13, an output transistor PM and an output terminal OUT. In the regulator circuit 2, the controller 10 and the voltage monitor circuit 11 are operated between a power supply voltage VDD and a ground voltage VSS. In the regulator circuit 2, the buffer circuit 13 is supplied with the power supply voltage VDD and a step-up voltage VDDH as power supplies on the high-voltage side and supplied with the ground voltage VSS as a power supply on the low-voltage side. In the regulator circuit 2, the step-up voltage VDDH is supplied to a source of the output transistor PM.

Here, the power supply voltage VDD and an output voltage VDDM are respectively the same voltage, e.g., a voltage of 1.2V or so. The step-up voltage VDDH is a voltage having a voltage or potential higher than the power supply voltage VDD, e.g., a voltage of 1.35V or so.

The third embodiment will first explain a feature about the configuration of coupling of the output transistor PM. In the regulator circuit 2 according to the third embodiment, the buffer circuit 13 also has a feature, but its feature will be described later.

As shown in FIG. 14, in the regulator circuit 2 according to the third embodiment, a backgate terminal of the output transistor PM is coupled to its drain. Such coupling of the output transistor PM makes it possible to prevent a reduction in the voltage of the drain of the output transistor PM during a period in which the output transistor PM is in a cutoff state. A diagram for describing the operation of the output transistor PM during the period in which the output transistor PM is in the cutoff state, is shown in FIG. 15.

Figure 15:
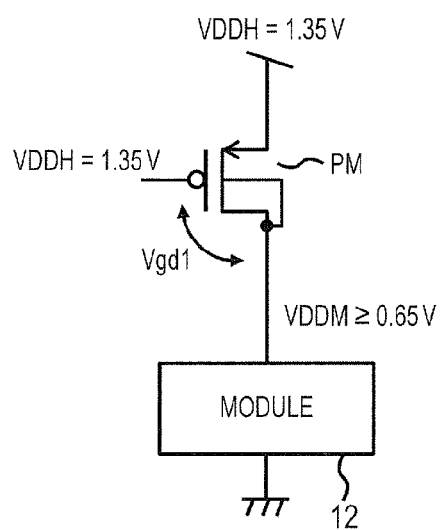
FIG. 15 is a diagram for describing a voltage value of an output voltage where an output transistor of the regular circuit according to the third embodiment is in an off state.

As shown in FIG. 15, when the output transistor PM is in the cutoff state, the step-up voltage VDDH is applied to its gate. At this time, in the regulator circuit 2 according to the third embodiment, the voltage VDDM of the drain of the output transistor PM becomes greater than or equal to 0.65V. This is because when the output transistor PM is in the cutoff state, a diode is formed between the source and backgate of the output transistor and the voltage of the drain of the output transistor PM is clamped by the diode. With such a coupled configuration, in the regulator circuit 2 according to the third embodiment, the gate-to-drain voltage Vgd1 of the output transistor PM at the time that the output transistor PM is in the cutoff state, can be set to 0.7V or so.

Figure 16:
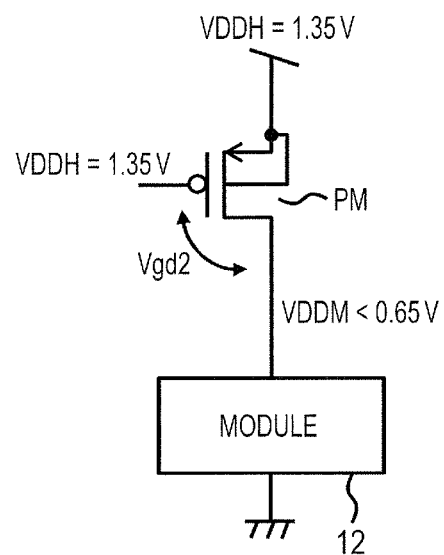
FIG. 16 is a diagram for explaining a voltage value of an output voltage where an output transistor having adopted a general coupled configuration.

On the other hand, a description will be made of as a comparative example, the operation of the output transistor PM of the cutoff state where the coupling of the output transistor PM is taken as a general coupled configuration. Thus, a diagram for describing the operation of the output transistor PM of the cutoff state where the coupling of the output transistor PM is taken as the general coupled configuration, is shown in FIG. 16. As shown in FIG. 16, the backgate of the output transistor PM is coupled to its source in the general coupled configuration. When the output transistor PM reaches the cutoff state where such a coupled configuration is taken, the voltage VDDM of the drain of the output transistor PM becomes less than or equal to 0.65V. This is because with the output transistor PM being brought to the cutoff state, the supply of current to the module 12 is stopped, and the voltage of the drain of the output transistor PM is reduced due to a leak current of the module 12. That is, when the output transistor PM is taken as the general coupled configuration, the gate-to-drain voltage Vgd1 of the output transistor PM at the time that the output transistor PM is in the cutoff state, becomes greater than or equal to 0.7V, thus resulting in being in danger of causing degradation in breakdown voltage.

From the above description, the regulator circuit 2 according to the third embodiment has features that it includes an output terminal to which a load circuit that consumes a load current is coupled and from which an output voltage is generated, a plurality of output transistors each of which has terminals one of which is coupled to a power supply terminal and the other of which is coupled to the output terminal, and controls the magnitude of the output voltage relative to the magnitude of the load current according to a control value indicated by an impedance control signal supplied to a control terminal, a voltage monitor circuit which monitors the output voltage and outputs an output voltage monitor value indicative of the value of the output voltage, and a control circuit which controls the magnitude of the control value according to the magnitude of an error value between a reference voltage indicative of a target value of the output voltage and the output voltage monitor value and controls based on the control value whether any of the output transistors should be brought into a conducting state, and that the output transistors have backgate and drain terminals coupled to one another.

With the regulator circuit 2 having such features, the gate-to-drain voltage Vgd1 of the output transistor PM at the time that the output transistor PM is in the cutoff state, can be set to 0.7V or so in the regulator circuit 2 according to the third embodiment. The regulator circuit 2 according to the third embodiment is capable of suppressing the occurrence of degradation in breakdown voltage even if a transistor having a breakdown voltage of 1.2V or so, which is identical to the transistor that configures the module 12, is used as the output transistor PM.

Figure 17:
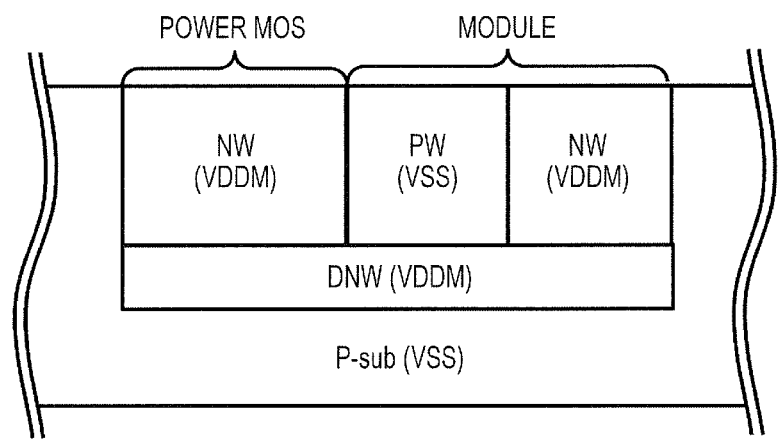
FIG. 17 is a sectional view of a semiconductor device for describing a vertical structure of the output transistor of the regular circuit according to the third embodiment.

A layout of the output transistor PM will now be explained. A sectional view of a semiconductor device, showing a vertical structure of the output transistor PM of the regulator circuit 2 according to the third embodiment is first shown in FIG. 17. As shown in FIG. 17, the output transistor PM of the regulator circuit 2 according to the third embodiment is formed in an N-well region NW adjacent to a P-well region PW in which the transistor that configures the module 12 is formed. An output VDDM is applied to the N-well region NW formed with the output transistor PM.

Figure 18:
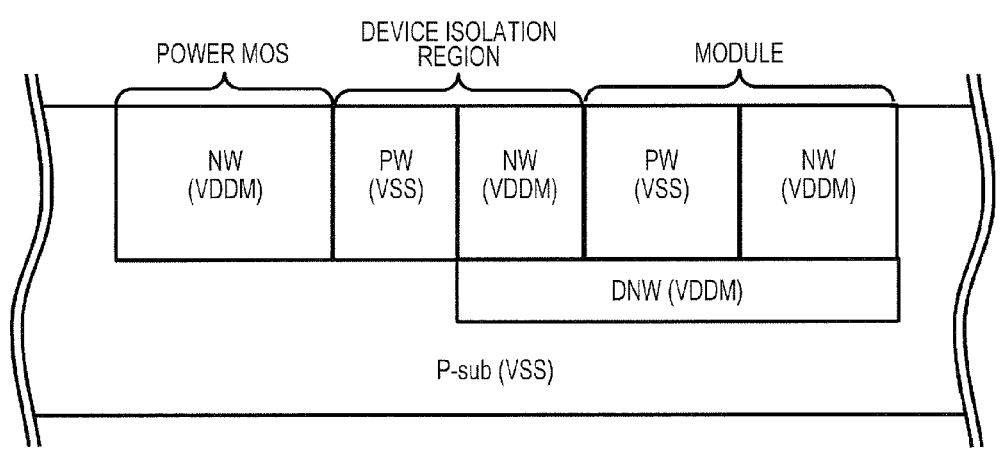
FIG. 18 is a sectional view of a semiconductor device for describing a vertical structure of an output transistor having adopted a general coupled configuration.

A description will be made of as a comparative example, a layout of the output transistor PM where a general coupled configuration is adopted for the coupled configuration of the output transistor PM. A sectional view of a semiconductor device, showing a vertical structure of the output transistor PM having the general coupled configuration is shown in FIG. 18. As shown in FIG. 18, an N-well region formed with the output transistor PM having adopted the general coupled configuration is formed in separation from a P-well region PW and an N-well region NW formed with a transistor that configures a module. More specifically, the N-well region formed with the output transistor PM having adopted the general coupled configuration is formed so as to be adjacent to the P-well region PW formed with the transistor that configures the module, through a device isolation region. This is because since a backgate voltage different from that of the PMOS transistor that configures the module is applied to the N-well region formed with the output transistor PM having adopted the general coupled configuration, it is necessary to prevent the flow of current between wells by the formation of the device isolation region. Incidentally, although deep well regions DNW are used in FIGS. 17 and 18, a layout free of the insertion of the deep well regions DNW is also possible because a substrate potential VSS is common.

From the above description, in the regulator circuit 2 according to the third embodiment, the N-well region NW formed with the output transistor PM can be formed so as to adjoin the P-well region PW formed with the transistor that configures the module 12. Thus, in the regulator circuit 2 according to the third embodiment, the device isolation regions each required to form the output transistor PM having adopted the general coupled configuration can be reduced, and the area of a semiconductor chip can be reduced.

Subsequently, the buffer circuit 13 of the regulator circuit 2 according to the third embodiment will be explained in detail. As shown in FIG. 14, the buffer circuit 13 is provided between the controller 10 and the power MOS transistor PM.

As shown in FIG. 14, in the regulator circuit 2, the controller 10 is operated between a first upper limit voltage (e.g., power supply voltage VDD) and a first lower limit voltage (e.g., ground voltage VSS). The output transistor PM has a source to which a second upper limit voltage (e.g., step-up voltage VDDH) of a voltage value higher than the first upper limit voltage is applied. The buffer circuit 13 converts the amplitude of an impedance control signal from a first amplitude to a second amplitude higher in upper and lower limit voltages than the first amplitude.

Figure 19:
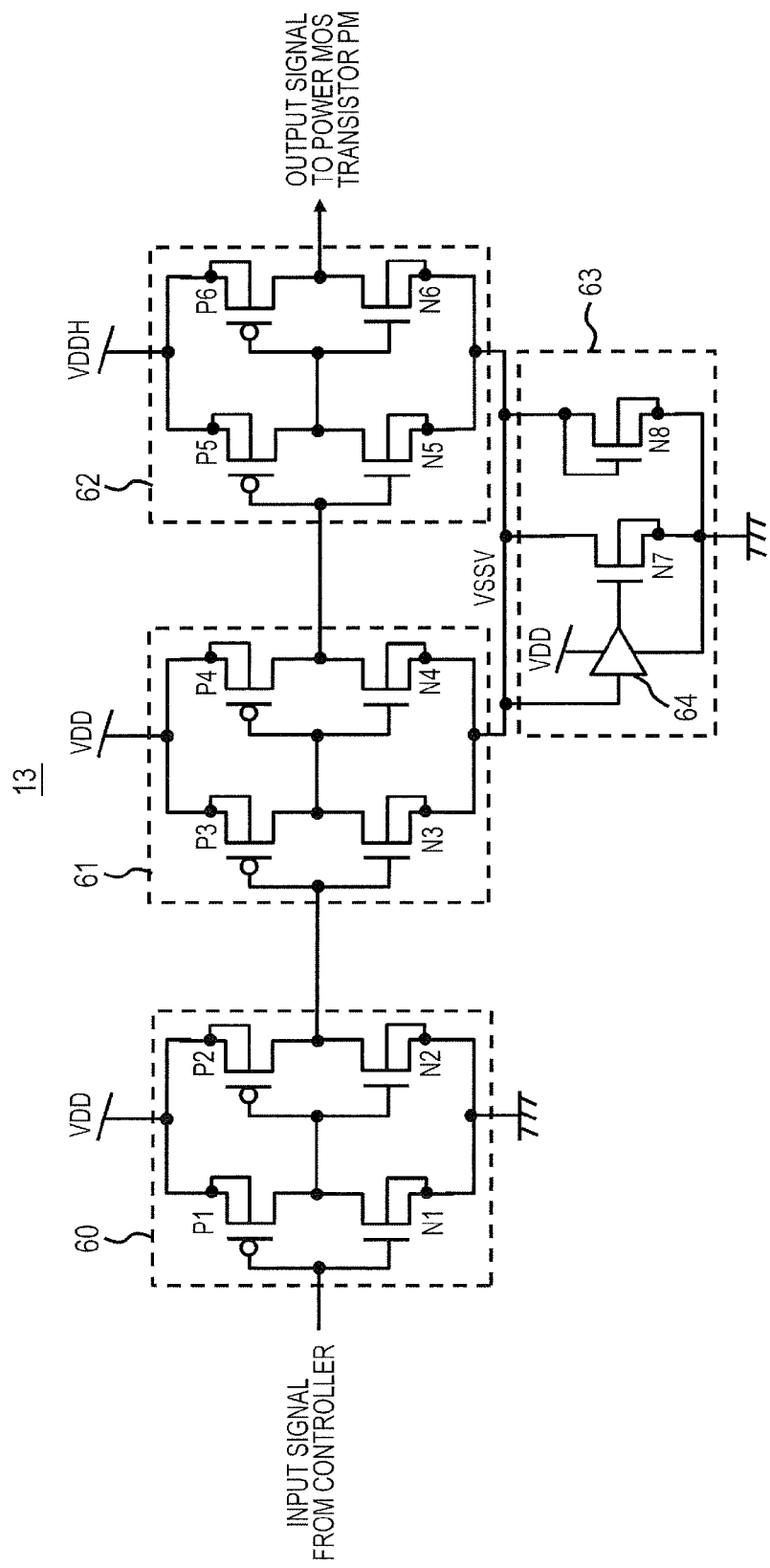
FIG. 19 is a circuit diagram of a buffer circuit of the regulator circuit according to the third embodiment.

Thus, a detailed circuit diagram of the buffer circuit 13 is shown in FIG. 19. As shown in FIG. 19, the buffer circuit 13 has a first buffer circuit 60, a second buffer circuit 61, a third buffer circuit 62 and a breakdown-voltage relaxation voltage generating circuit 63.

The first buffer circuit 60 is operated between a first upper limit voltage (e.g., power supply voltage VDD) and a first lower limit voltage (e.g., ground voltage VSS). The first buffer circuit 60 outputs the impedance control signal outputted from the controller 10 to the second buffer circuit 61 coupled to a subsequent stage as it is.

More specifically, the first buffer circuit 60 has two inverters coupled in series. Of the two inverters, the inverter coupled in a previous stage thereof is comprised of a PMOS transistor P1 and an NMOS transistor N1. The inverter coupled in a subsequent stage of the two inverters is comprised of a PMOS transistor P2 and an NMOS transistor N2. Sources of the PMOS transistors P1 and P2 are supplied with the power supply voltage VDD, and sources of the NMOS transistors N1 and N2 are supplied with the ground voltage VSS.

The second buffer circuit 61 is operated between a first upper limit voltage (e.g., power supply voltage VDD) and a second lower limit voltage (e.g., breakdown-voltage relaxation voltage VSSV) of a voltage higher than the first lower limit voltage. The second buffer circuit 61 takes an upper limit voltage of an amplitude of the impedance control signal outputted from the first buffer circuit 60 as the power supply voltage VDD and converts its lower limit voltage to the breakdown-voltage relaxation voltage VSSV, followed by outputting it therefrom.

More specifically, the second buffer circuit 61 has two inverters coupled in series. The inverter coupled in a previous stage of the two inverters is comprised of a PMOS transistor P3 and an NMOS inverter N3. The inverter coupled in a subsequent stage of the two inverters is comprised of a PMOS transistor P4 and an NMOS transistor N4. Sources of the PMOS transistors P3 and P4 are supplied with the power supply voltage VDD. Sources of the NMOS transistors N3 and N4 are supplied with the breakdown-voltage relaxation voltage VSSV.

The third buffer circuit 62 is operated between a second upper limit voltage (e.g., step-up voltage VDDH) of a voltage higher than the first upper limit voltage and a second lower limit voltage (e.g., breakdown-voltage relaxation voltage VSSV). The third buffer circuit 62 converts an upper limit voltage of an amplitude of the impedance control signal outputted from the second buffer circuit 61 to the step-up voltage VDDH and outputs its lower limit voltage as the breakdown-voltage relaxation voltage VSSV.

More specifically, the third buffer circuit 62 has two inverters coupled in series. The inverter coupled in a previous stage of the two inverters is comprised of a PMOS transistor P5 and an NMOS transistor N5. The inverter coupled in a subsequent stage of the two inverters is comprised of a PMOS transistor P6 and an NMOS transistor N6. Sources of the PMOS transistors P5 and P6 are supplied with the step-up voltage VDDH. Sources of the NMOS transistors N5 and N6 are supplied with the breakdown-voltage relaxation voltage VSSV.

The breakdown-voltage relaxation voltage generating circuit 63 generates a second lower limit voltage (e.g. breakdown-voltage relaxation voltage VSSV). The breakdown-voltage relaxation voltage generating circuit 63 has a breakdown-voltage relaxation voltage generating element, a first transistor (N7) and a step-up detection circuit (e.g., low threshold value comparator 64). Incidentally, although the breakdown-voltage relaxation voltage VSSV is generated using the breakdown-voltage relaxation voltage generating circuit 63 in the buffer circuit 13 according to the third embodiment, the breakdown-voltage relaxation voltage VSSV may be input from outside or can also be generated using a circuit of another configuration such as a constant voltage source circuit or the like.

The breakdown-voltage relaxation voltage generating element is provided between a first node at which the breakdown-voltage relaxation voltage VSSV is generated, and a second node supplied with the ground voltage VSS and generates the breakdown-voltage relaxation voltage VSSV. More specifically, in the third embodiment, the breakdown-voltage relaxation voltage generating element is formed of an NMOS transistor N8. The NMOS transistor N8 is a diode-coupled transistor. A source of the NMOS transistor N8 is supplied with the ground voltage VSS. A drain and gate of the NMOS transistor N8 is coupled to the first node. Incidentally, the sources of the NMOS transistors N3 through N6 are coupled to the first node. Incidentally, the threshold voltage of the NMOS transistor N8 has a voltage of 0.15V or so, for example. This threshold voltage is assumed to be the breakdown-voltage relaxation voltage VSSV.

The low threshold value comparator 64 is operated between a first upper limit voltage (e.g., power supply voltage VDD) and a first lower limit voltage (e.g., ground voltage VSS) and detects a rise in second lower limit voltage (e.g., breakdown-voltage relaxation voltage VSSV) to bring a voltage suppression signal to an enable state. The low threshold value comparator 64 has, as a threshold voltage LVTH, the value of the breakdown-voltage relaxation voltage VSSV that switches between the enable state of the voltage suppression signal and its disenable state. The threshold voltage LVTH is a voltage higher than the breakdown-voltage relaxation voltage VSSV and is a voltage of the order of the difference between the voltage and the power supply voltage VDD being able to maintain such a voltage difference that the second buffer circuit 61 is able to operate fully.

The first transistor is coupled between the first node and the second node and brought to a conducting state where the voltage suppression signal is in the enable state. Specifically, the first transistor is comprised of an NMOS transistor N7. The NMOS transistor N7 has a source supplied with the ground voltage VSS and a drain coupled to the first node. The NMOS transistor N7 is supplied with the output (voltage suppression signal) of the low threshold value comparator 64. The NMOS transistor N7 is brought to a conducting state where the voltage suppression signal is in the enable state (e.g., high level). When the voltage suppression signal is in the disenable state (e.g., low level), the NMOS transistor N7 is brought to a cutoff state.

Subsequently, a description will be made of voltages applied to the transistors that configure the buffer circuit 13 according to the third embodiment. In the buffer circuit 13, elements having potential for causing degradation in breakdown voltage are transistors to which the highest voltage is applied. In the buffer circuit 13, the transistors to which the highest voltage is applied, are the PMOS transistor P6 and the NMOS transistor N6. The voltages applied to the PMOS transistor P6 and the NMOS transistor N6 will be explained below.

Figure 20:
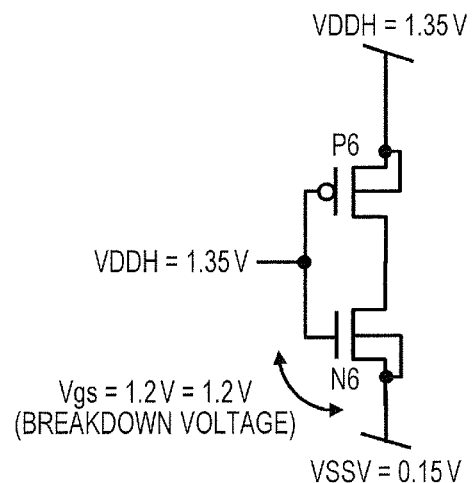
FIG. 20 is a diagram for describing the maximum voltage value applied to an NMOS transistor in the buffer circuit of the regulator circuit according to the third embodiment.

A diagram for describing the value of the maximum voltage applied to the NMOS transistor N6 is shown in FIG. 20. As shown in FIG. 20, a state in which an input signal of the inverter including the NMOS transistor N6 reaches a step-up voltage VDDH, is a state in which the voltage applied to the NMOS transistor N6 becomes maximum. Such a state is generated when the pre-stage inverter of the third buffer circuit 62 outputs a high-level signal. At this time, in the buffer circuit 13 according to the third embodiment, a breakdown-voltage relaxation voltage VSSV is applied to the source of the NMOS transistor N6. Therefore, even in the state shown in FIG. 20, a gate-to-source voltage Vgs of the NMOS transistor N6 becomes 1.2V. That is, the buffer circuit 13 according to the third embodiment is capable of preventing the occurrence of degradation in breakdown voltage even if the breakdown voltage of the NMOS transistor N6 is assumed to be the same voltage (e.g., 1.2V) as the transistor that configures the module 12.

Incidentally, in the buffer circuit 13 according to the third embodiment, an upper limit voltage of an amplitude of an output signal of the third buffer circuit 62 becomes the step-up voltage VDDH, and its lower limit voltage becomes the breakdown-voltage relaxation voltage VSSV. Therefore, even when a low level is given as the voltage of the gate of the output transistor PM, the voltage becomes the breakdown-voltage relaxation voltage VSSV. That is, in the regulator circuit 2 according to the third embodiment, even when the low level is given as the gate voltage of the output transistor PM, the gate-to-source voltage of the output transistor can be set below a breakdown voltage, and degradation in the breakdown voltage of the output transistor can hence be prevented.

Figure 21:
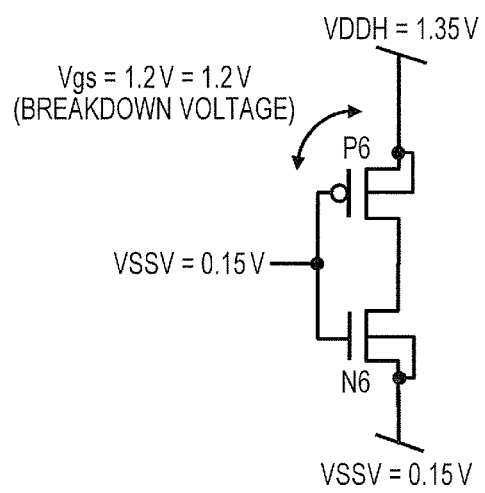
FIG. 21 is a diagram for explaining the maximum voltage applied to a PMOS transistor in the buffer circuit of the regulator circuit according to the third embodiment.

A diagram for describing the value of the maximum voltage applied to the PMOS transistor P6 is shown in FIG. 21. As shown in FIG. 21, a state in which an input signal of the inverter including the PMOS transistor P6 reaches a breakdown-voltage relaxation voltage VSSV, is a state in which the voltage applied to the PMOS transistor P6 becomes maximum. Such a state is generated when the pre-stage inverter of the third buffer circuit 62 outputs a low-level signal. At this time, in the buffer circuit 13 according to the third embodiment, a step-up voltage VDDH is applied to the source of the PMOS transistor P6. Therefore, even in the state shown in FIG. 21, a gate-to-source voltage Vgs of the PMOS transistor P6 becomes 1.2V. That is, the buffer circuit 13 according to the third embodiment is capable of preventing the occurrence of degradation in breakdown voltage even if the breakdown voltage of the PMOS transistor P6 is assumed to be the same voltage (e.g., 1.2V) as the transistor that configures the module 12.

Figure 22:
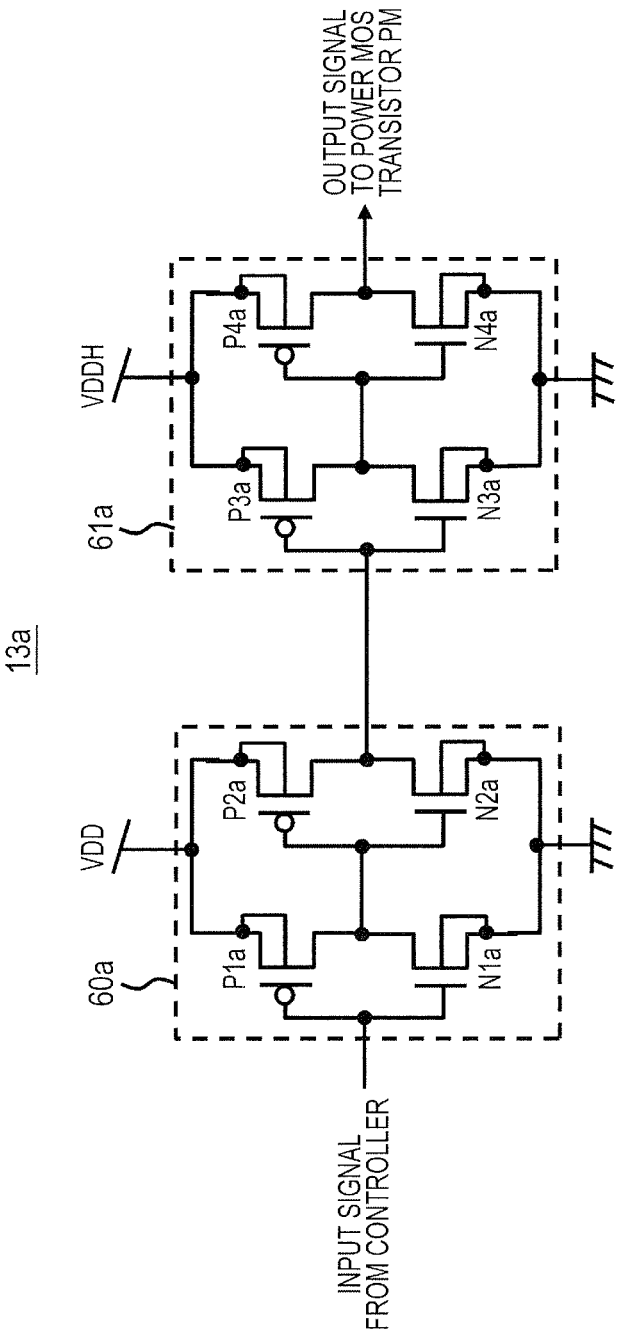
FIG. 22 is a circuit diagram of a general buffer circuit.

A general buffer circuit 13a free of the use of the breakdown-voltage relaxation voltage VSSV will now be explained as a comparative example. A circuit diagram of the general buffer circuit 13a is shown in FIG. 22. A shown in FIG. 22, the general buffer circuit 13a is comprised of buffer circuits 60a and 61a of two stages. The buffer circuit 60a provided in the previous stage is operated between a power supply voltage VDD and a ground voltage VSS. On the other hand, the buffer circuit 61a provided in the subsequent stage is operated between a step-up voltage VDDH and the ground voltage VSS.

In the buffer circuit 13 shown in FIG. 22, the transistors to which the highest voltage is applied are a PMOS transistor P4a and an NMOS transistor N4a that configure an inverter disposed in a subsequent stage of the buffer circuit 61a. Thus, the voltages applied to the PMOS transistor P4a and the NMOS transistor N4a will be described below.

Figure 23:
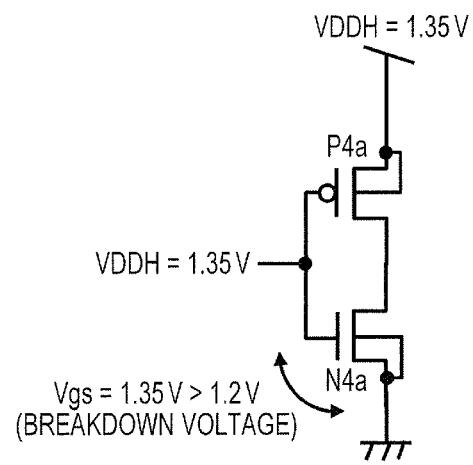
FIG. 23 is a diagram for describing the maximum voltage value applied to an NMOS transistor in the general buffer circuit.

A diagram for describing the value of the maximum voltage applied to the NMOS transistor N4a is shown in FIG. 23. As shown in FIG. 23, a state in which an input signal of the inverter including the NMOS transistor N4a becomes a step-up voltage VDDH, is a state in which the voltage applied to the NMOS transistor N4a becomes maximum. Such a state is generated when the pre-stage inverter of the buffer circuit 61a outputs a high-level signal. At this time, in the general buffer circuit 13a, a ground voltage VSS is applied to a source of the NMOS transistor N4a. Therefore, in the state shown in FIG. 23, a gate-to-source voltage Vgs of the NMOS transistor N4a becomes 1.35V. At this time, in the general buffer circuit 13a, a problem arises in that degradation in breakdown voltage occurs assuming that the breakdown voltage of the NMOS transistor N4a is taken as the same voltage (e.g., 1.2V) as the transistor that configures the module 12. In order to avoid such a problem, a high-voltage element must be used as the NMOS transistor N4a.

Incidentally, in the general buffer circuit 13a, an upper limit voltage of an amplitude of an output signal of the buffer circuit 61a becomes the step-up voltage VDDH, and its lower limit voltage becomes the ground voltage VSS. Therefore, when a low level is given as the voltage of the gate of the output transistor PM, the voltage becomes the ground voltage VSS. That is, the general regulator circuit 2 is accompanied by a problem that since the gate-to-source voltage of the output transistor exceeds a breakdown voltage where the low level is given as the gate voltage of the output transistor PM, a high-voltage element must be used as the output transistor.

Figure 24:
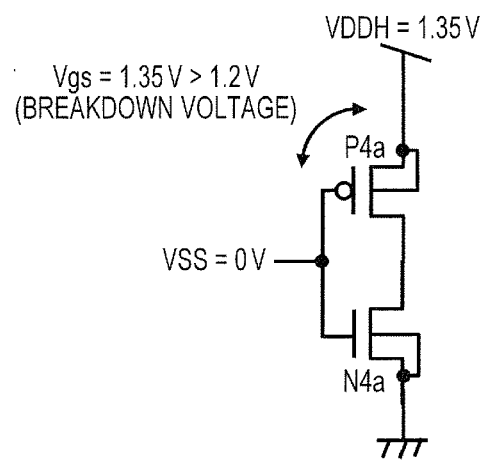
FIG. 24 is a diagram for describing the maximum voltage value applied to a PMOS transistor in the general buffer circuit.

A diagram for describing the value of the maximum voltage applied to the PMOS transistor P4a is shown in FIG. 24. As shown in FIG. 24, a state in which an input signal of the inverter including the PMOS transistor P4a becomes a ground voltage VSS, is a state in which the voltage applied to the PMOS transistor P4a becomes maximum. Such a state is generated when the pre-stage inverter of the buffer circuit 61a outputs a low-level signal. At this time, in the general buffer circuit 13, a step-up voltage VDDH is applied to a source of the PMOS transistor P4a. Therefore, in the state shown in FIG. 24, a gate-to-source voltage Vgs of the PMOS transistor P4a becomes 1.35V. At this time, in the general buffer circuit 13 according to the third embodiment, a problem arises in that degradation in breakdown voltage occurs assuming that the breakdown voltage of the PMOS transistor P4a is taken as the same voltage (e.g., 1.2V) as the transistor that configures the module 12. In order to avoid such a problem, a high-voltage element must be used as the PMOS transistor P4a.

The operation of the buffer circuit 13 according to the third embodiment will subsequently be described. The buffer circuit 13 has one feature in that the upper and lower limit voltages of the amplitude differ between the input and output signals. Since, however, the basic operation is only to transfer each signal, the description thereof will be omitted herein. The operation of the breakdown-voltage relaxation voltage generating circuit 63, which is another feature of the buffer circuit 13, will be explained below.

Figure 25:
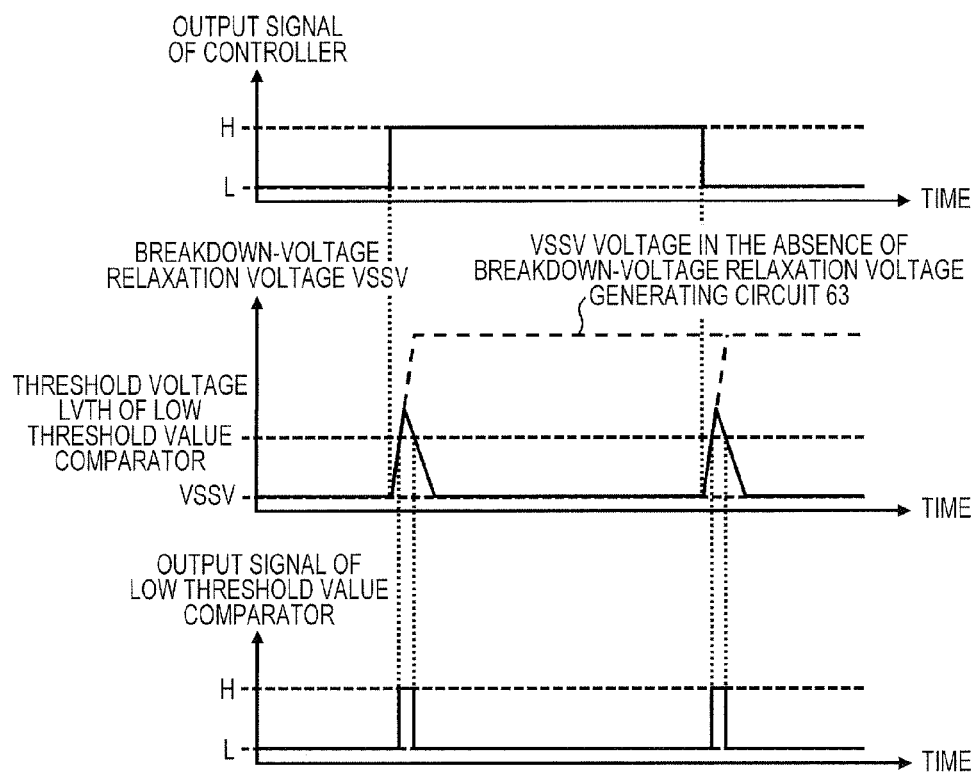
FIG. 25 is a timing chart showing the operation of the buffer circuit of the regulator circuit according to the third embodiment.

A timing chart showing the operation of the breakdown-voltage relaxation voltage generating circuit 63 is shown in FIG. 25. As shown in FIG. 25, the voltage of the breakdown-voltage relaxation voltage VSSV fluctuates in timing at which the signal level of the impedance control signal input to the buffer circuit 13 is switched. This is a phenomenon developed because although current flows into the first node at which the breakdown-voltage relaxation voltage VSSV is generated according to the switching of the signal level of the impedance control signal, but it is not possible for the NMOS transistor N8 alone to drain the current.

Thus, the breakdown-voltage relaxation voltage generating circuit 63 brings the voltage suppression signal of the low threshold value comparator 64 to an enable state (e.g., high level) only during a period in which the voltage of the breakdown-voltage relaxation voltage VSSV reaches greater than or equal to the threshold value of the low threshold value comparator 64. The NMOS transistor N7 is brought to a conducting state according to the voltage suppression signal only during a period in which the voltage becomes greater than or equal to the threshold value of the low threshold value comparator 64. Thus, the buffer circuit 13 is capable of pulling out an electric charge from the first node during the period in which the voltage becomes greater than or equal to the threshold value of the low threshold value comparator 64 to suppress a rise in the breakdown-voltage relaxation voltage VSSV and hastening the resetting of the voltage level of the breakdown-voltage relaxation voltage VSSV in a steady state. As a comparative example, FIG. 25 has shown fluctuations in the breakdown-voltage relaxation voltage VSSV where the breakdown-voltage relaxation voltage generating circuit 63 is not used. A problem arises in that since no electric charge is pulled out from the first node where the breakdown-voltage relaxation voltage generating circuit 63 is not used as shown in FIG. 25, the time taken to restore the voltage level of the breakdown-voltage relaxation voltage VSSV in the steady state while the breakdown-voltage relaxation voltage VSSV remains raised becomes long.

From the above description, the regulator circuit according to the third embodiment includes an output terminal to which a load circuit that consumes a load current is coupled and from which an output voltage is generated, a plurality of output transistors each of which has terminals one of which is coupled to a power supply terminal and the other of which is coupled to the output terminal, and controls the magnitude of the output voltage relative to the magnitude of the load current according to a control value indicated by an impedance control signal supplied to a control terminal, a voltage monitor circuit which monitors the output voltage and outputs an output voltage monitor value indicative of the voltage value of the output voltage, a control circuit which controls the magnitude of the control value according to the magnitude of an error value between a reference voltage indicative of a target value of the output voltage and the output voltage monitor value and controls based on the control value whether any of the output transistors should be brought to a conducting state, and a buffer circuit which is provided between the control circuit and the output transistors and converts the amplitude of the impedance control signal from a first amplitude to a second amplitude higher in upper and lower limit voltages than the first amplitude.

The buffer circuit has a first buffer circuit operated between the first upper limit voltage and the first lower limit voltage, a second buffer circuit operated between the first upper limit voltage and a second lower limit voltage of a voltage higher than the first lower limit voltage, and a third buffer circuit operated between a second upper limit voltage of a voltage higher than the first upper limit voltage, and the second lower limit voltage.

The buffer circuit has a breakdown-voltage relaxation voltage generating circuit which generates the second lower limit voltage. The breakdown-voltage relaxation voltage generating circuit has a breakdown-voltage relaxation voltage generating element which is provided between a first node at which the second lower limit voltage is generated, and a second node supplied with the first lower limit voltage, and which generates the second lower limit voltage, a step-up detection circuit which is operated between the first upper limit voltage and the first lower limit voltage and detects a rise in the second lower limit voltage to bring a voltage suppression signal to an enable state, and a first transistor which is coupled between the first node and the second node and brought to a conducting state when the voltage suppression signal is in the enable state.

With such a configuration as described above, the regulator circuit according to the third embodiment is capable of using the transistors each having the breakdown voltage less than or equal to the step-up voltage as the transistors to each of which the step-up voltage having the voltage value greater than or equal to the breakdown voltage is applied. In the regulator circuit 3 according to the third embodiment, all the circuits are configured using the transistors small in breakdown voltage, thereby making it possible to reduce their circuit areas.

Figure 26:
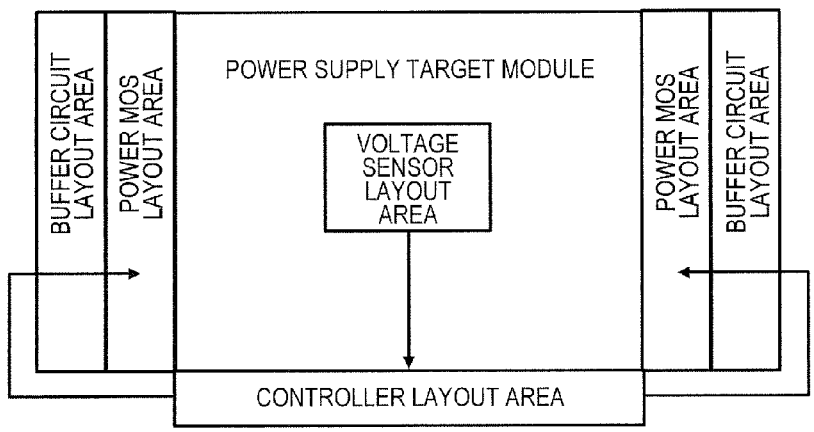
FIG. 26 is a schematic diagram illustrating one example of a layout of the regulator circuit according to the third embodiment.
Figure 27:
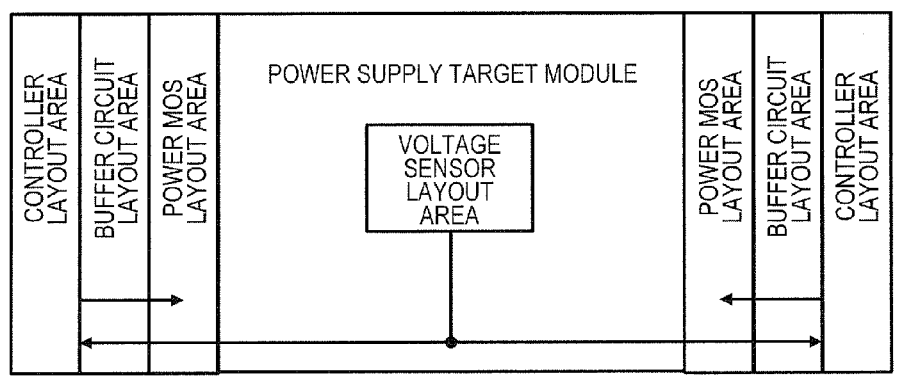
FIG. 27 is a schematic diagram showing another example of a layout of the regulator circuit according to the third embodiment.

A layout of the regulator circuit 2 according to the third embodiment will subsequently be described. Thus, schematic diagrams of planar layouts of the regulator circuit 2 are shown in FIGS. 26 and 27. Although FIGS. 26 and 27 are different in terms of the layout of a controller layout area, the layouts of other areas are the same. As shown in FIGS. 26 and 27, the voltage monitor circuit 11 of the regulator circuit 2 is laid out in the central part of a power supply target module. Power MOS layout areas are provided so as to interpose the power supply target module therebetween. A buffer circuit layout area is provided outside each power MOS layout area.

Incidentally, in FIGS. 26 and 27, the controller 10 is formed in the controller layout area, the buffer circuit 13 is formed in the buffer circuit layout area, the output transistor PM is formed in the power MOS layout area, and the voltage monitor circuit 11 is formed in a voltage monitor circuit forming area, respectively.

Figure 28:
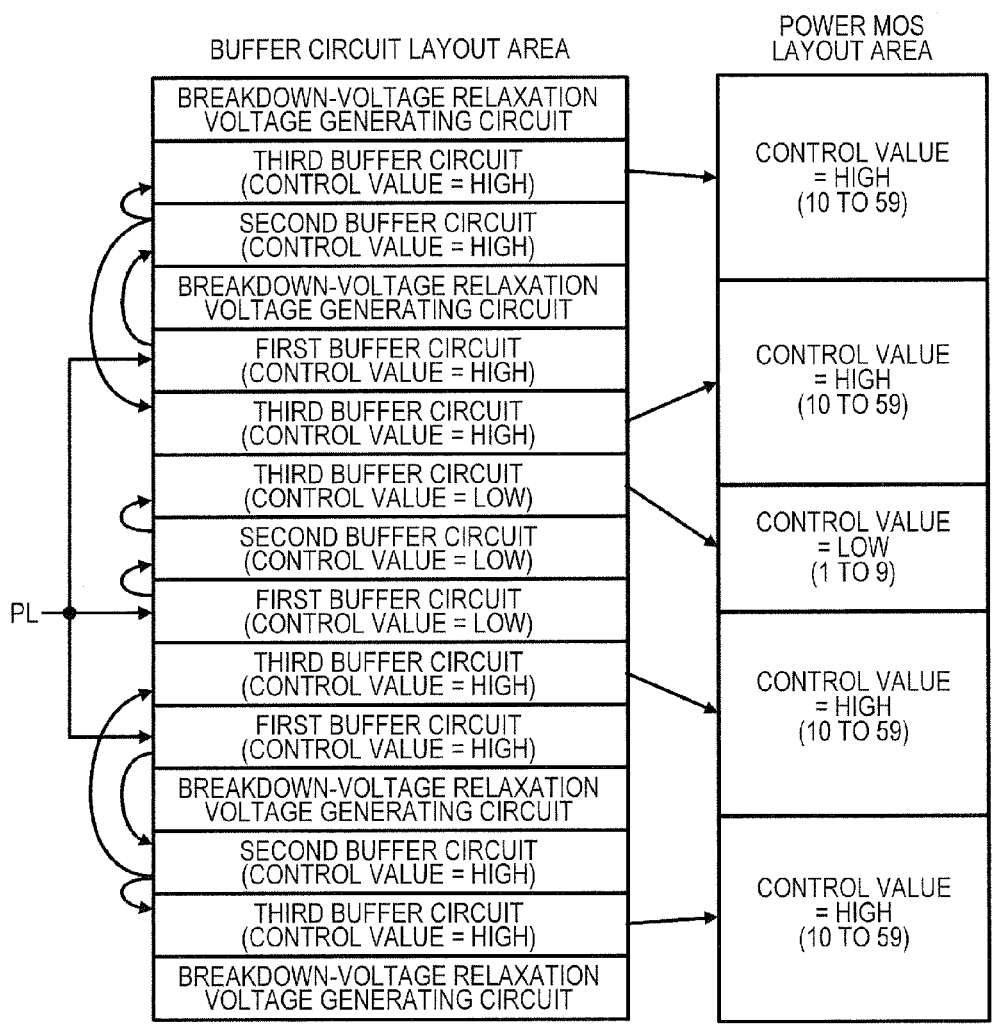
FIG. 28 is a schematic diagram depicting layouts of the buffer circuit and the output transistor in the regulator circuit according to the third embodiment.

A description will now be made of detailed layouts of the buffer circuit layout area and the power MOS layout area. A schematic diagram showing the layouts of the buffer circuit layout area and the power MOS layout area is shown in FIG. 28. As shown in FIG. 28, in the regulator circuit 2 according to the third embodiment, output transistors are formed in such a manner that output transistors corresponding to control values PL high in value interpose output transistors corresponding to control values PL low in value therebetween. In the example illustrated in FIG. 28, since the output transistors corresponding to the control values PL high in value increase exponentially in area, these output transistors are laid out in four-division form. The output transistors corresponding to the control values PL high in value are respectively placed in positions where two output transistor forming areas corresponding to the control values PL high in value are laid out above and below.

Even as to buffer circuits, the buffer circuits are laid out in such a manner that the buffer circuits corresponding to control values PL high in value interpose buffer circuits corresponding to control values PL low in value. Output transistors are then formed. The buffer circuits corresponding to the control values PL high in value are respectively laid out in areas that interpose the buffer circuits corresponding to the control values PL low in value therebetween. Further, the buffer circuits corresponding to the control values PL high in value are laid out in such a manner that two third buffer circuits 62 are formed with respect to one second buffer circuit 61. The breakdown-voltage relaxation voltage generating circuits 63 are laid out in dispersed form in conjunction with third buffer circuits 62 corresponding to control values PL being high values.

Laying out the buffer circuits and output transistors corresponding to the control values PL being of the high values in dispersed form above and below in this way makes it possible to cause vertical current supply paths in the area with the module 12 laid out therein to be symmetric with each other and distribute the concentration of current density in one direction. Although the output transistors corresponding to the control values PL being of the high values are divided or split into four in the above description, the number of their division may be changed as appropriate according to the circuit scale and the number of stages of the output transistors.

Figure 29:
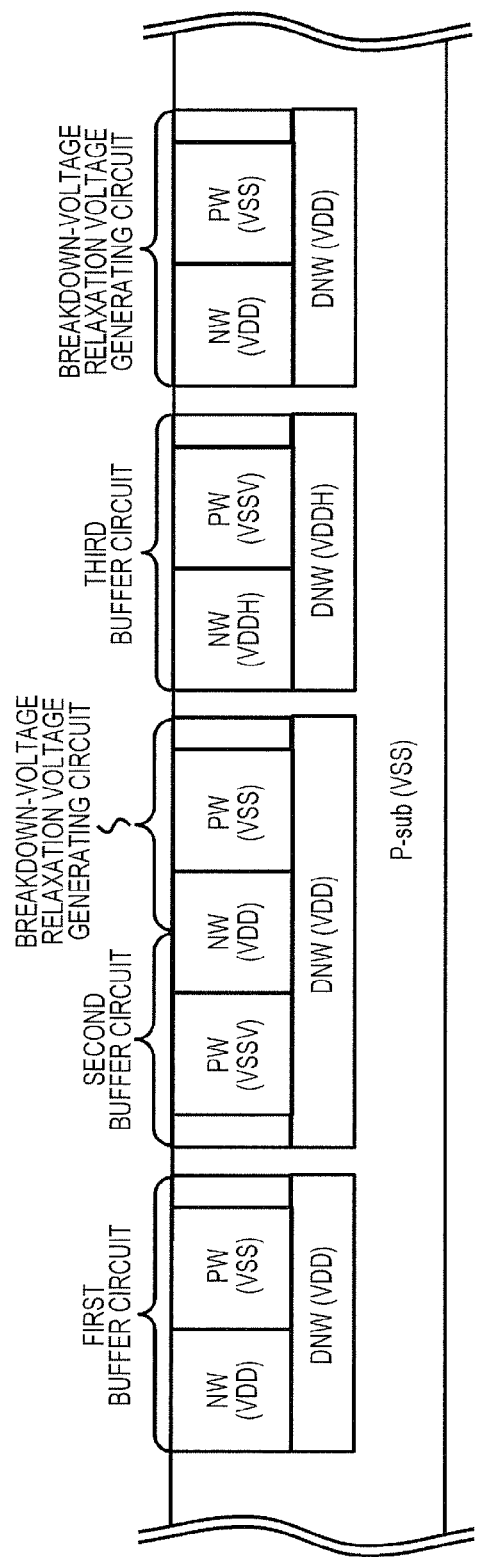
FIG. 29 is a sectional view of a semiconductor device for describing one example of a vertical structure of the buffer circuit in the regulator circuit according to the third embodiment.
Figure 30:
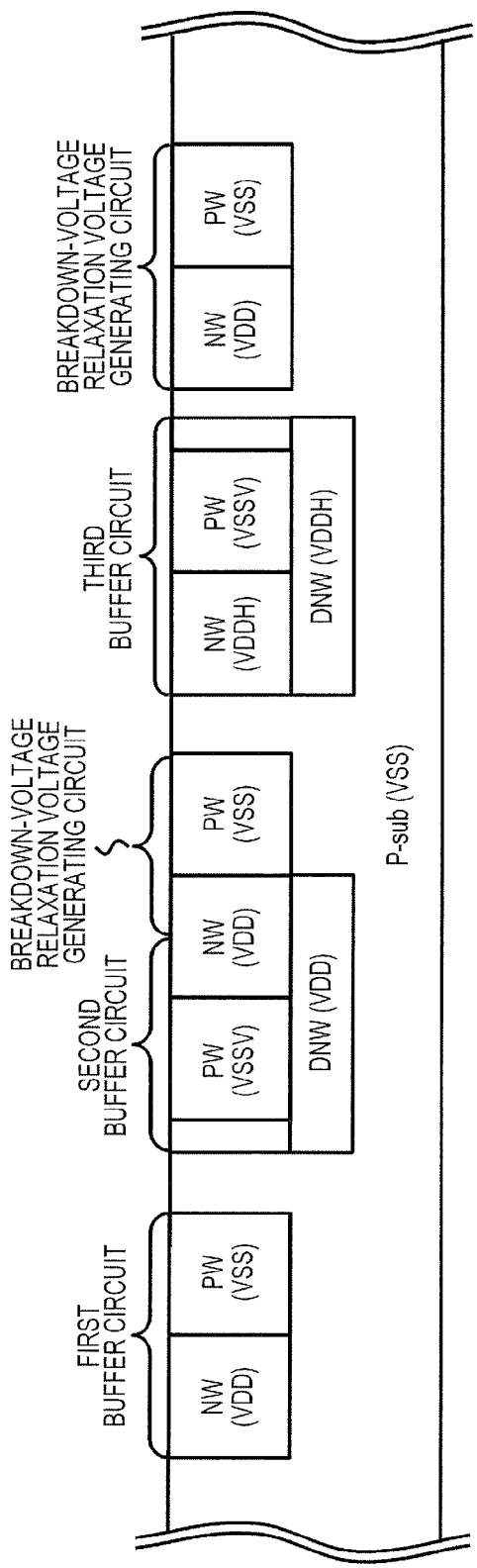
FIG. 30 is a sectional view of a semiconductor device for describing another example of a vertical structure of the buffer circuit in the regulator circuit according to the third embodiment.

A description will subsequently be made of a vertical structure of the first through third buffer circuits 60 through 62 and the breakdown-voltage relaxation voltage generating circuit. Thus, one example of a vertical structure of the first through third buffer circuits 60 through 62 and the breakdown-voltage relaxation voltage generating circuit is shown in FIG. 29. Another example of a vertical structure of the first through third buffer circuits 60 through 62 and the breakdown-voltage relaxation voltage generating circuit is shown in FIG. 30.

The first buffer circuit 60 is operated between a power supply voltage VDD and a ground voltage VSS. Therefore, as shown in FIGS. 29 and 30, a PMOS transistor of the first buffer circuit 60 is formed in an N-well region NW to which the power supply voltage VDD is applied. An NMOS transistor of the first buffer circuit 60 is formed in a P-well region PW to which the ground voltage VSS is applied.

The second buffer circuit 61 is operated between the power supply voltage VDD and a breakdown-voltage relaxation voltage VSSV. Therefore, as shown in FIGS. 29 and 30, a PMOS transistor of the second buffer circuit 61 is formed in an N-well region NW to which the power supply voltage VDD is applied. An NMOS transistor of the second buffer circuit 61 is formed in a P-well region PW to which the breakdown-voltage relaxation voltage VSSV is applied.

The third buffer circuit 62 is operated between a step-up voltage VDDH and the breakdown-voltage relaxation voltage VSSV. Therefore, as shown in FIGS. 29 and 30, a PMOS transistor of the third buffer circuit 62 is formed in an N-well region NW to which the step-up voltage VDDH is applied. An NMOS transistor of the third buffer circuit 62 is formed in a P-well region PW to which the breakdown-voltage voltage VSSV is applied.

The breakdown-voltage relaxation voltage generating circuit 63 is operated between the power supply voltage VDD and the ground voltage VSS. Therefore, as shown in FIGS. 29 and 30, a PMOS transistor of the breakdown-voltage relaxation voltage generating circuit 63 is formed in an N-well region NW to which the power supply voltage VDD is applied. An NMOS transistor of the breakdown-voltage relaxation voltage generating circuit 63 is formed in a P-well region PW to which the ground voltage VSS is applied. Incidentally, since a PMOS transistor of a circuit in the breakdown-voltage relaxation voltage generating circuit 63, which is formed in the neighborhood of the second buffer circuit 61, is supplied with the same backgate voltage as the PMOS transistor of the second buffer circuit 61, the PMOS transistor thereof is formed in its corresponding N-well region NW formed with the second buffer region 61.

In the example shown in FIG. 29, deep well regions DNW are formed below in all well regions. On the other hand, in the example shown in FIG. 30, a deep well region DNW is formed only below a P-well region with the breakdown-voltage relaxation voltage VSSV applied thereto and an N-well region NW formed with a PMOS transistor that pairs with an NMOS transistor formed in the P-well region. The deep well region DNW is formed to achieve the insulation between a P-well region brought to a well potential different from the voltage applied to a P-sub region P-sub, and the P-sub region P-sub. Therefore, as shown in FIGS. 29 and 30, each deep well region can be deformed according to design specs about in which region it should be formed below. By inserting the deep well regions DNW overall as shown in FIG. 29, for example, variations in characteristics of the transistors can be suppressed. On the other hand, as shown in FIG. 30, the deep well regions DNW are formed only in the required portions, thereby making it possible to reduce a circuit area.

A description will subsequently be made of layouts of power supply wirings for the buffer circuit 13. the output transistor PM and the module 12 in the regulator circuit 2 according to the third embodiment. Schematic diagrams showing the layouts of the power supply wirings for the regulator circuit 2 according to the third embodiment are shown in FIGS. 31 through 34.

Figure 31:
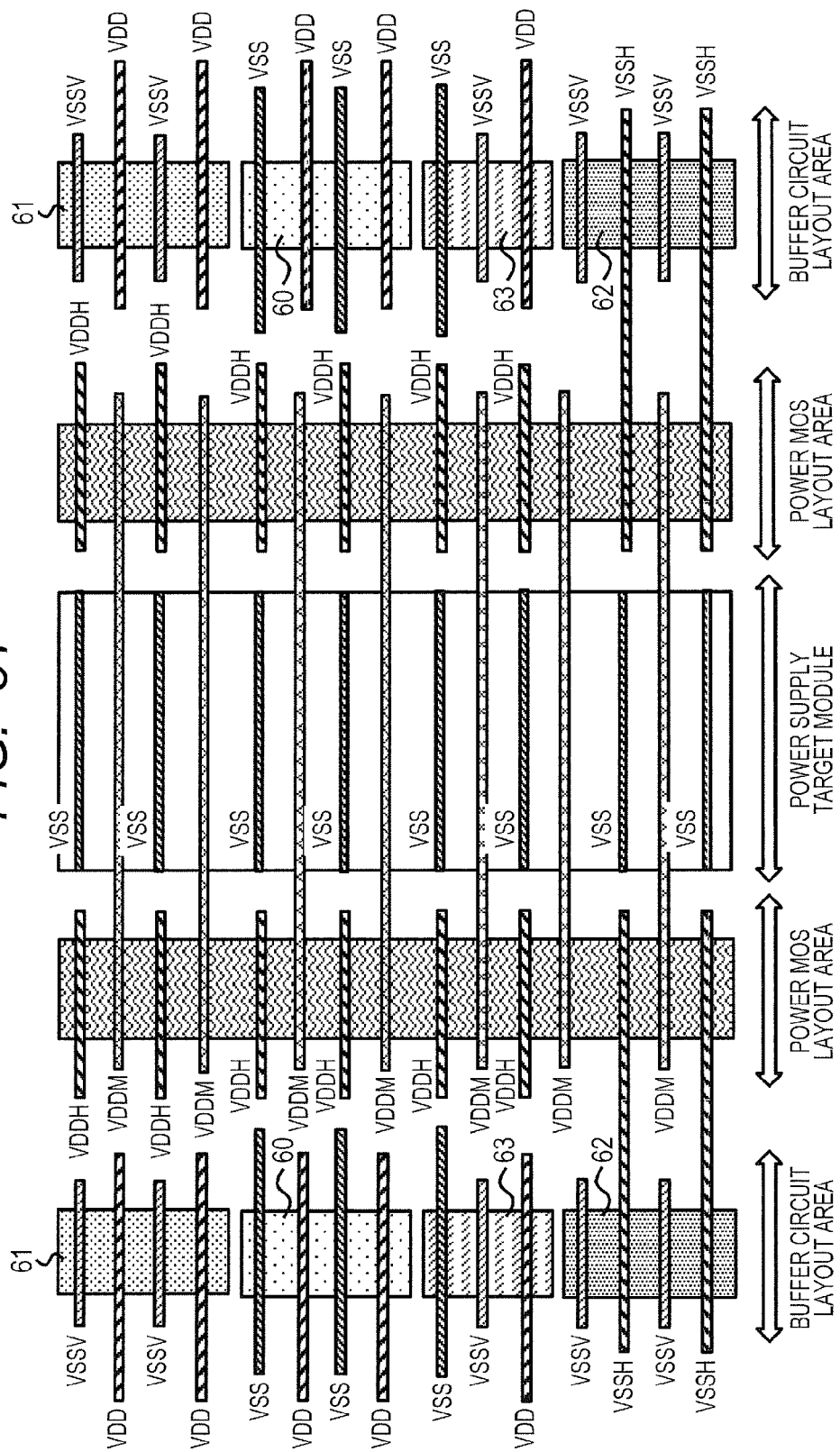
FIG. 31 is a schematic diagram for describing a layout of a first power supply wiring layer for the buffer circuit, output transistor and module in the regulator circuit according to the third embodiment.

FIG. 31 is a schematic diagram showing a layout of a first power supply wiring layer of the power supply wirings, which becomes a bottom layer. In the example shown in FIG. 31, there are shown, in order to describe the power supply wirings for the buffer circuit 13, the output transistor PM and the module 12, areas in which the first buffer circuit 60, the second buffer circuit 61, the third buffer circuit 62 and the breakdown-voltage relaxation voltage generating circuit 63 are formed, and power MOS layout areas each formed with the output transistor PM, and an area in which the module 12 is formed.

As shown in FIG. 31, a ground wiring VSS and a power supply wiring VDD are disposed in a layer above the area in which the first buffer circuit 60 is formed. This is because the first buffer circuit 60 is supplied with the power supply voltage VDD and the ground voltage VSS.

A wiring (hereinafter referred to as a breakdown-voltage relaxation power supply wiring) that configures the first node, which is supplied with the breakdown-voltage relaxation voltage VSSV, and the power supply wiring VDD are disposed in a layer above the area in which the second buffer circuit 61 is formed. This is because the second buffer circuit 61 is supplied with the power supply voltage VDD and the breakdown-voltage relaxation voltage VSSV.

The breakdown-voltage relaxation power supply wiring VSSV and a step-up power supply wiring VDDH are disposed in a layer above the area in which the second buffer circuit 62 is formed. This is because the third buffer circuit 62 is supplied with the step-up voltage VDDH and the breakdown-voltage relaxation voltage VSSV. The step-up power supply wiring VDDH has a length that extends from the area formed with the third buffer circuit 62 to the power MOS layout area.

The power supply wiring VDD, the breakdown-voltage relaxation power supply wiring VSSV and the ground wiring VSS are disposed in a layer above the area formed with the breakdown-voltage relaxation voltage generating circuit 63. This is because the breakdown-voltage relaxation voltage generating circuit 63 is operated between the step-up voltage VDDH and the breakdown-voltage relaxation voltage VSSV and generates a breakdown-voltage relaxation voltage VSSV.

A step-up wiring VDDH and an internal power supply wiring VDDM are formed in a layer above the power MOS layout area. This is because the power supply wirings coupled to the output transistor PM are of the step-up wiring VDDH and the internal power supply wiring VDDM. Incidentally, the internal power supply wiring VDDM is supplied with an output voltage VDDM. The internal power supply wiring VDDM has a length that extends from one power MOS layout area to another power MOS layout area and is formed so as to couple the two power MOS layout areas to each other. That is, the internal power supply wiring VDDM is formed so as to stride across the area formed with the module 12.

Incidentally, each power supply wiring for the first power supply wiring layer and each element supplied with power from the power supply wiring are coupled to each other via contacts.

Figure 32:
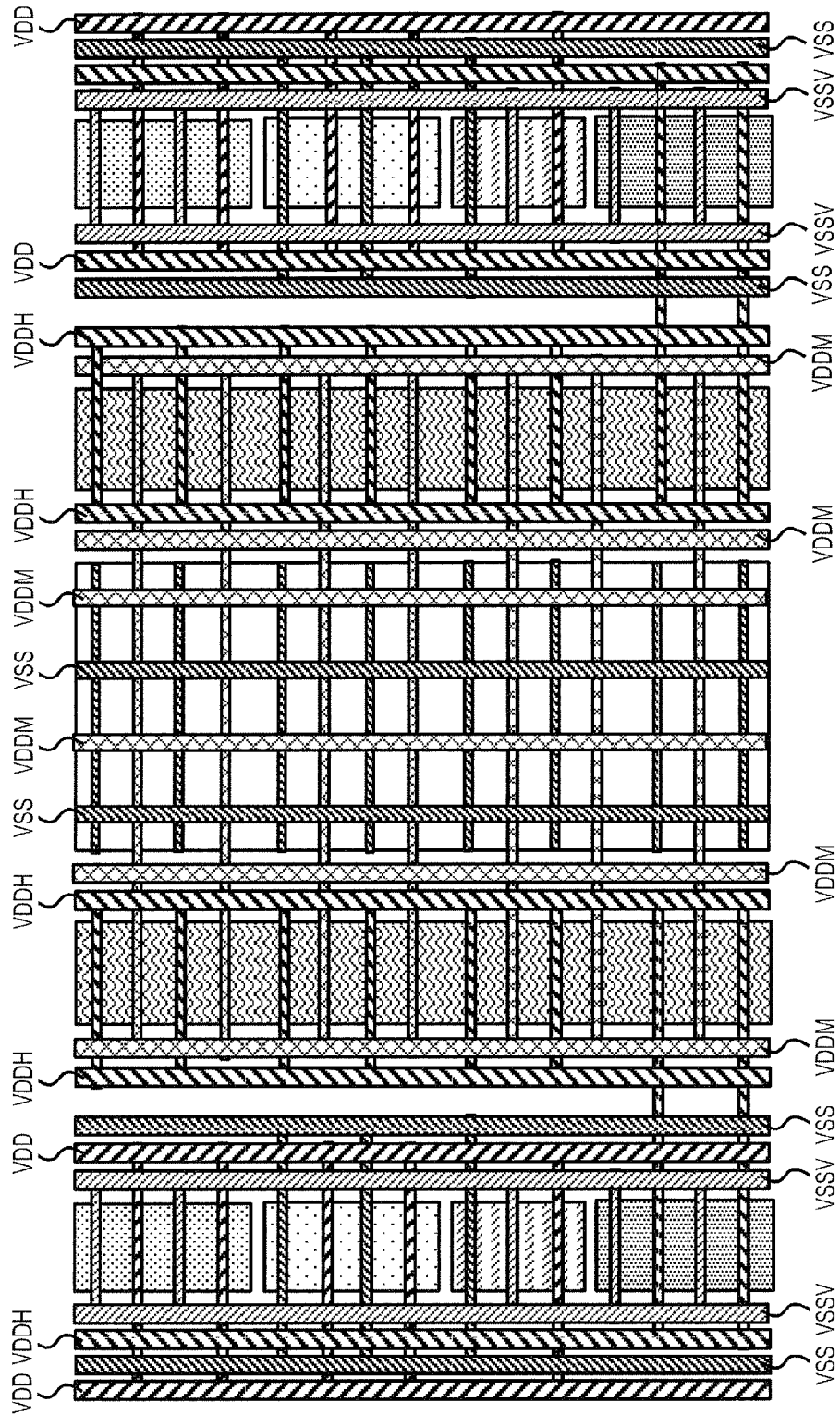
FIG. 32 is a schematic diagram for describing a layout of a second power supply wiring layer for the buffer circuit, output transistor and module in the regulator circuit according to the third embodiment.

Next, a schematic diagram showing a layout of a second power supply wiring layer formed in a layer above the first power supply wiring layer, of the power supply wirings is shown in FIG. 32. In the first power wiring layer, each power supply wiring is formed in the horizontal direction as viewed in the drawing, but in the second power supply layer, each power supply wiring is formed in the vertical direction as viewed in the drawing. In the second power supply wiring layer, the power supply wirings are formed so as to couple to each other the power supply wirings in the first power supply wirings, to which the same voltage is applied. In the second power supply layer, each power supply wiring is formed by a wiring thicker than the power supply wiring for the first power supply wiring layer. The power supply wiring for the second power supply wiring layer and the power supply wiring for the first power supply wiring layer are coupled to each other via contacts.

Figure 33:
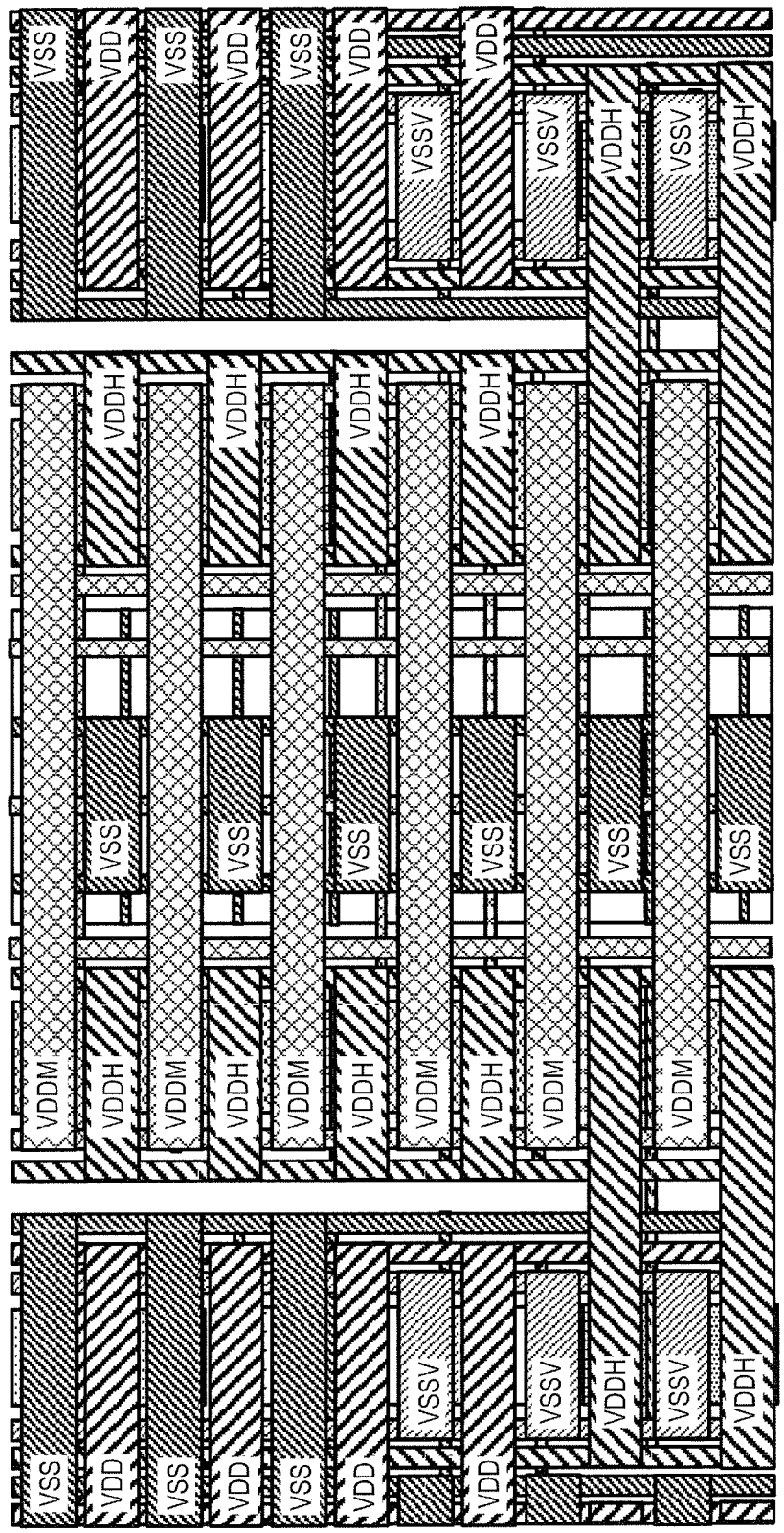
FIG. 33 is a schematic diagram for describing a layout of a third power supply wiring layer for the buffer circuit, output transistor and module in the regulator circuit according to the third embodiment.

Next, a schematic diagram showing a layout of a third power supply wiring layer formed in a layer above the second power supply wiring layer, of the power supply wirings is shown in FIG. 33. In the second power supply wiring layer, each power supply wiring is formed in the vertical direction as viewed in the drawing, but in the third power supply wiring layer, each power supply wiring is formed in the horizontal direction as viewed in the drawing. In the third power supply wiring layer, the power supply wirings are formed so as to couple to each other the power supply wirings in the second power supply wirings, to which the same voltage is applied. In the third power supply wiring layer, each power supply wiring is formed by a wiring thicker than the power supply wiring for the second power supply wiring layer. The power supply wiring for the third power supply wiring layer and the power supply wiring for the second power supply wiring layer are coupled to each other via contacts.

Figure 34:
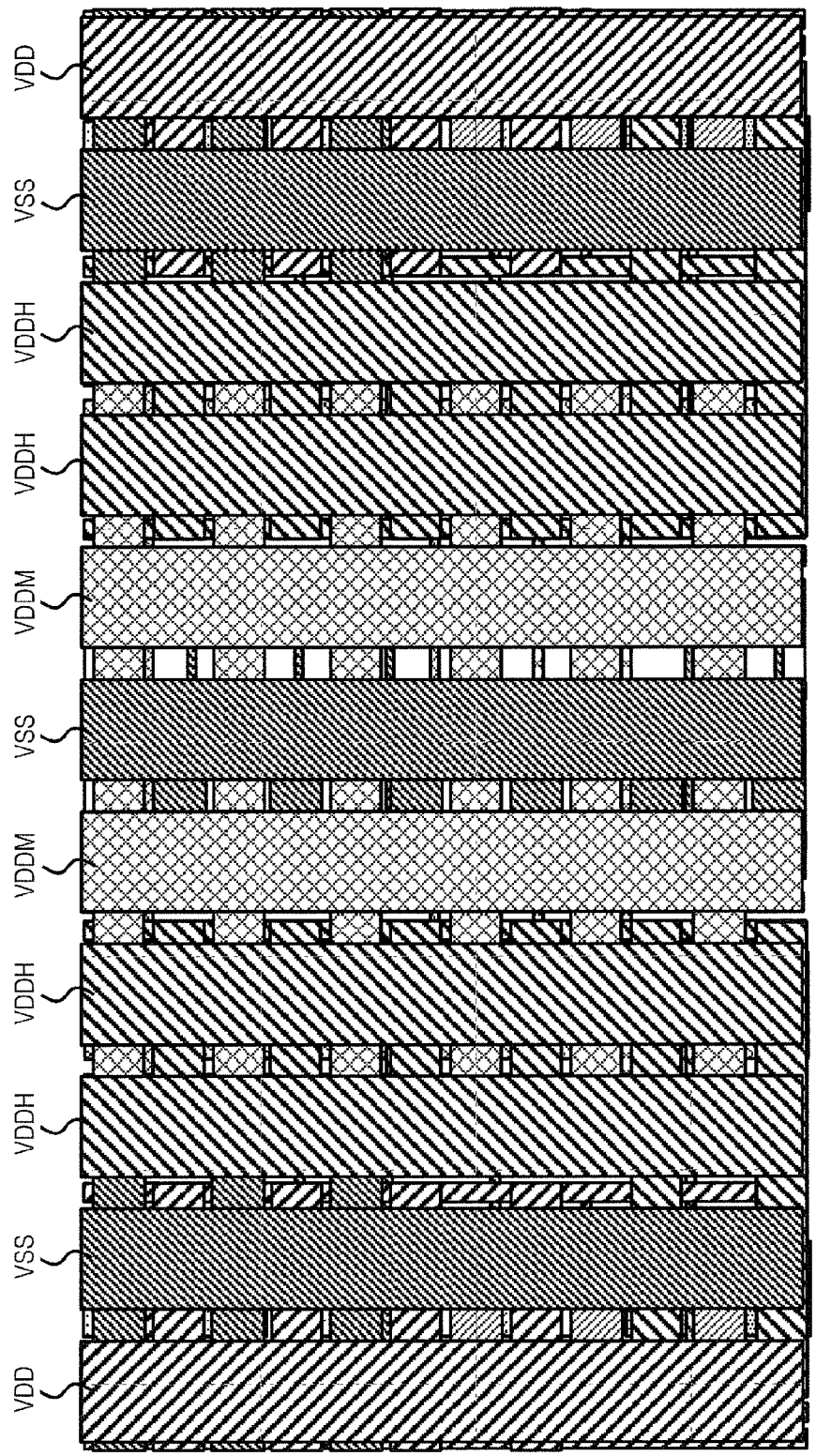
FIG. 34 is a schematic diagram for describing a layout of a fourth power supply wiring layer for the buffer circuit, output transistor and module in the regulator circuit according to the third embodiment.

Next, a schematic diagram showing a layout of a fourth power supply wiring layer formed in a layer above the third power supply wiring layer, of the power supply wirings is shown in FIG. 34. In the third power wiring layer, each power supply wiring is formed in the horizontal direction as viewed in the drawing, but in the fourth power supply wiring layer, each power supply wiring is formed in the vertical direction as viewed in the drawing. In the fourth power supply wiring layer, the power supply wirings are formed so as to couple to each other the power supply wirings in the third power supply wirings, to which the same voltage is applied. In the fourth power supply wiring layer, each power supply wiring is formed by a wiring thicker than the power supply wiring for the third power supply wiring layer. The power supply wiring for the fourth power supply wiring layer and the power supply wiring for the third power supply wiring layer are coupled to each other via contacts. Incidentally, although FIG. 34 shows the example including no breakdown-voltage relaxation voltage VSS in the fourth power supply wiring layer, each power supply wiring to which the breakdown-voltage relaxation voltage VSSV is applied may be formed in the fourth power supply wiring layer where a margin for resources of the fourth power supply wiring layer is given. In such a case, there is obtained an effect that the voltage level of the breakdown-voltage relaxation voltage VSSV is stabilized.

In the regulator circuit 2 according to the third embodiment, there are five types of power supplies. A problem therefore arises in that when the allocation of wiring resources is not properly performed, the wiring resistance of each power supply becomes high so that the operation of the circuit becomes instable. Thus, the allocation of global wiring layer resources to the respective power supplies is changed for each area using the fact that the areas in which the various power supply wirings are used are limited. In the example shown in FIG. 34, the allocation of global wiring layers is shared between VDD and VSS on the left side of the buffer circuit layout area. The allocation thereof is shared between VDD, VSS, VSSV and VDDH in the layer above the buffer circuit layout area and shared between VDDH and VDDM in the layer above the power MOS layout area. Adopting such a power supply wiring structure enables a reduction in wiring resistance relative to the area in which each power supply is used. Since it is necessary to supply VDD and VSSV to the second buffer circuit 61, for example, two types of global power-supply main wirings of VDD and VSSV are laid out in the layer above the second buffer circuit 61. Likewise, since it is necessary to supply VDD and VSS to the first buffer circuit 60, two types of global power-supply main wirings of VDD and VSS are disposed in the layer above the first buffer circuit 60. The breakdown-voltage relaxation voltage generating circuit 63 and the third buffer circuit 62 are also similar to the above below. Changing the rate of use of the global wiring layers as the power-supply main wirings for each area in this way makes it possible to reduce the wiring resistance of each power-supply main wiring in the area in which the power-supply main wiring is used, and thereby to stabilize a circuit operation.

A power-on sequence of the regulator circuit 2 according to the third embodiment will subsequently be described. In the regulator circuit 2 according to the third embodiment, the output transistor PM is supplied with a step-up voltage VDDH having a voltage value higher than the breakdown voltage of the transistor. Therefore, when the power-on sequence is not properly controlled, a voltage higher than the breakdown voltage is applied to the transistor so that the transistor is in danger of being destroyed.

Figure 35:
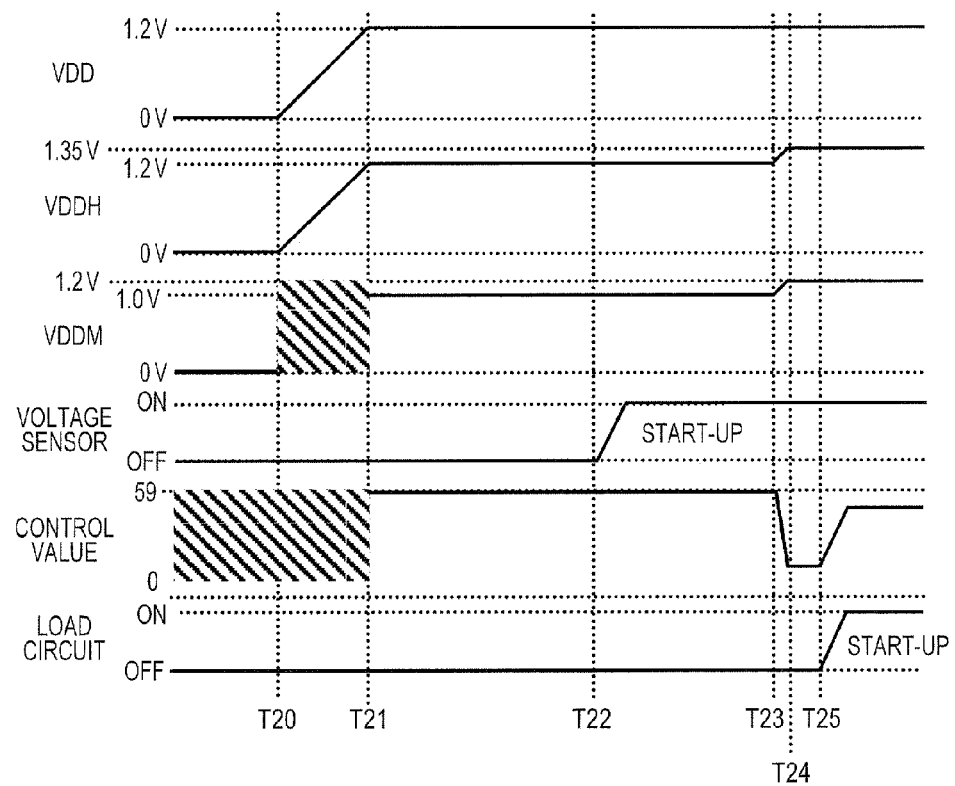
FIG. 35 is a timing chart for describing one example of a start-up procedure of the regulator circuit according to the third embodiment.

A timing chart showing one example of the power-on sequence of the regulator circuit 2 according to the third embodiment is shown in FIG. 35. In the example shown in FIG. 35, the power supply voltage VDD and step-up voltage VDDH are first raised at a timing T20. During this power-up operation, the step-up voltage VDDH is increased to the same 1.2V or so as the power supply voltage VDD without making its increase to 1.35V that is a final voltage.

At a timing T21, the power supply voltage VDD and the step-up voltage VDDH are raised to 1.2V or so. At the point of time when the timing T21 is reached, the operation of the controller 10 is started. At the timing T21, the controller 10 outputs an initial value as a control value PL. In the example shown in FIG. 35, the initial value of the control value PL is 59. That is, when the controller 10 starts operating at the timing T21, the output transistor PM starts operating in a state of being lowest in its resistance value. At the timing T21, the voltage monitor circuit 11 maintains a halt state. Therefore, at the timing T21, the output voltage VDDM of the regulator circuit 2 becomes 1.0V or so.

In response to the fact that the output voltage VDDM has been stabilized and has reached 1.0V or so, the voltage monitor circuit 11 is started up at a timing T22. Thus, the voltage value of the output voltage VDDM is notified from the voltage monitor circuit 11 to the controller 10, so that the controller 10 shifts to a normal operating state.

Subsequently, at timings T23 and T24, the step-up voltage VDDH is boosted to 1.35V or so that is a target voltage value. In response to the step-up operation of the step-up voltage VDDH at the timings T23 and T24, the controller 10 controls the output voltage VDDM to 1.0V or so while reducing the control value PL. Next, the module 12 is started up at a timing T25 after the control value PL of the controller 10 has been brought to a stable state. Since a load current Iload consumed or used up by the module 12 suddenly increases where the module 12 is started up, the controller 10 causes the control value PL to rise based on the operation described in the first embodiment.

The example shown in FIG. 35 has utilized a step-up circuit capable of varying each generated voltage value, as a step-up circuit that generates the step-up voltage VDDH. In such a case, as described above, the step-up voltage VDDH is boosted to the same voltage as the power supply voltage VDD and thereafter increased to the voltage taken as the final target in wait for the stable operation of the regulator circuit 2, thereby making it possible to control the voltage applied to each of the regulator circuit 2 and the module 12 so as not to exceed the breakdown voltage of each element.

Figure 36:
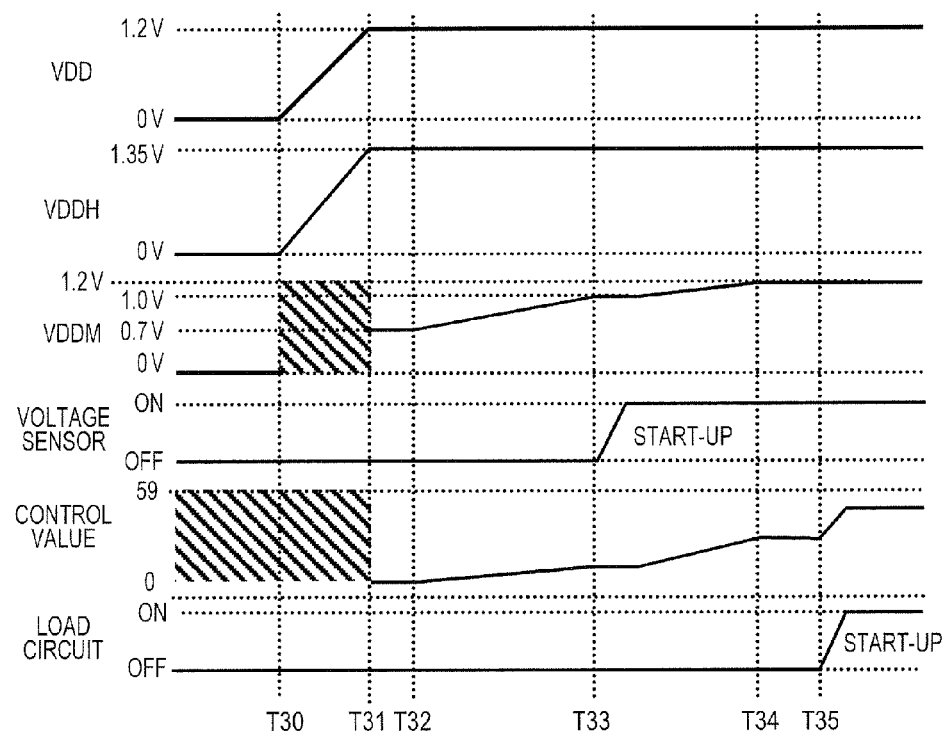
FIG. 36 is a timing chart for describing another example of a start-up procedure of the regulator circuit according to the third embodiment.

Subsequently, a timing chart showing another example of the power-on sequence of the regulator circuit 2 according to the third embodiment is shown in FIG. 36. In the example shown in FIG. 36, a power supply voltage VDD and a step-up voltage VDDH are first raised at a timing T30. During this power-up operation, the step-up voltage VDDH is increased to 1.35V that is a final voltage.

At a timing T31, the power supply voltage VDD and the step-up voltage VDDH are raised to 1.2V and 1.35V or so respectively. At the point of time when the timing T31 is reached, the operation of the controller 10 is started. At the timing T31, the controller 10 outputs an initial value as a control value PL. In the example shown in FIG. 36, the initial value of the control value PL is 0. That is, when the controller 10 starts operating at the timing T31, the output transistor PM starts operating in a state (cutoff state, for example) of being highest in its resistance value. At the timing T31, the voltage monitor circuit 11 maintains a halt state. Therefore, at the timing T31, the output voltage VDDM of the regulator circuit 2 becomes 0.7V or so.

In the example shown in FIG. 36, the controller 10 gradually increases the control value PL at timings T32 and T33. Thus, the output voltage VDDM gradually rises and reaches 1.0V or so. At the timing T33 when the output voltage VDDM becomes 1.0V or so, the voltage monitor circuit 11 starts up. Thus, the voltage value of the output voltage VDDM is notified from the voltage monitor circuit 11 to the controller 10, so that the controller 10 shifts to a normal operating state. At a timing T34, the output voltage reaches a targeted 1.2V or so.

Thereafter, the module 12 is started up at a timing T35 at which the output voltage VDDM is stabilized. Since a load current Iload consumed or used up by the module 12 suddenly increases where the module 12 is started up, the controller 10 increases the control value PL, based on the operation described in the first embodiment.

The example shown in FIG. 36 has utilized a step-up circuit not capable of varying each generated voltage value, as a step-up circuit that generates the step-up voltage VDDH. In such a case, as described above, the control is started from the minimized state of the control value PL to control the output voltage VDDM so as not to exceed the breakdown voltage of each element, thereby making it to increase the output voltage VDDM to a finally-targeted voltage (e.g., 1.2V). With this control, the voltage applied to each of the regulator circuit 2 and the module 12 can be controlled so as not to exceed the breakdown voltage of each element. Since one having a simple configuration can be used as the step-up circuit in FIG. 36, there is also a merit that the parts cost of a system can be reduced.

Fourth Embodiment

Figure 37:
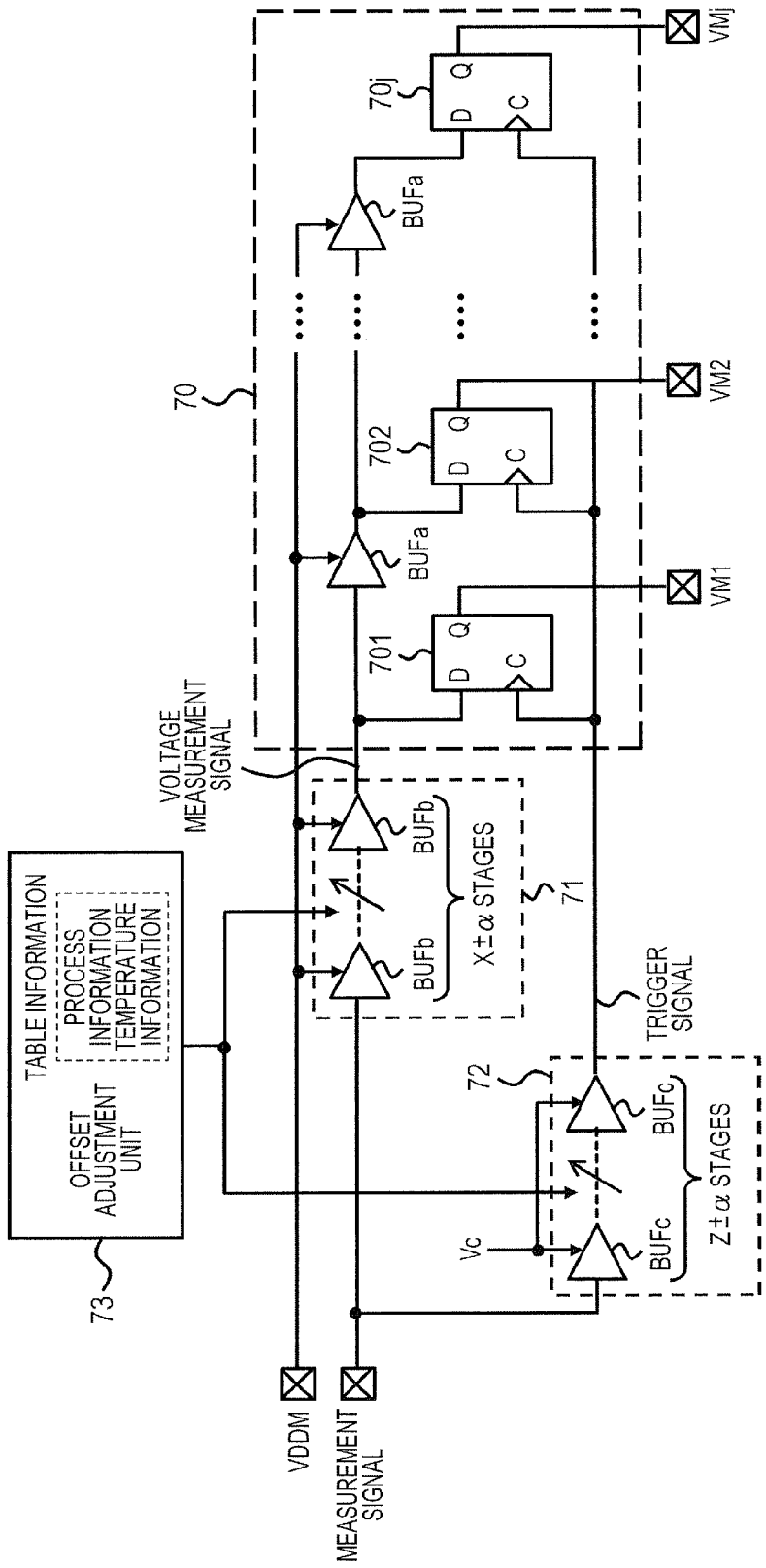
FIG. 37 is a block diagram of a voltage monitor circuit in a regulator circuit according to a fourth embodiment.

A fourth embodiment will explain the details of the voltage monitor circuit 11 of the regulator circuit 1 according to the first embodiment. A detailed block diagram of the voltage monitor circuit 11 is thus shown in FIG. 37. As shown in FIG. 37, the voltage monitor circuit 11 has a voltage measurement unit 70, a first delay circuit 71, a second delay circuit 72 and an offset adjustment unit 73.

The first delay circuit 71 delays a measurement signal indicative of a sampling timing of an output voltage VDDM through X (where X: integer) first delay adjustment buffers BUFb and outputs a voltage measurement signal. The output voltage VDDM is inputted to the first delay adjustment buffers BUFb as a power supply voltage. The first delay circuit 71 changes a delay time according to the magnitude of the output voltage VDDM. The first delay circuit 71 changes the number of the first delay adjustment buffers BUFb effectively operated according to an adjustment signal outputted from the offset adjustment unit 73.

The second delay circuit 72 delays the measurement signal through Z (where Z: integer) second delay adjustment buffers BUFc and generates a sampling trigger signal therefrom. The second delay adjustment buffers BUFc are inputted with a constant voltage Vc as a power supply voltage. The second delay adjustment buffers BUFb determines a delay time according to the magnitude of the constant voltage Vc. The second delay circuit 72 changes the number of the second delay adjustment buffers BUFc effectively operated according to the adjustment signal outputted from the offset adjustment unit 73. Incidentally, the adjusted number of delay adjustment buffers BUFc relative to the second delay circuit 72 is the same number as the adjusted number for the first delay circuit 71. Here, an offset controlled by the offset adjustment unit 73 is the same value as the gain (monitor gain) of the voltage monitor circuit 11. When the offset changes, it affects the loop characteristics of control and hence it needs to be a given constant range.

The voltage measurement unit 70 has a measurement signal transfer wiring and a plurality of sampling flip-flops 701 through 70j (where j: integer). The measurement signal transfer wiring transfers the voltage measurement signal through a plurality of delay buffers BUFa. Incidentally, the delay buffers BUFa are supplied with the output voltage VDDM as the power supply voltage. The delay buffers BUFa changes a delay time according to the voltage value of the output voltage VDDM. The sampling flip-flops 701 through 70j are inputted with either input signals or output signals of the delay buffers BUFa. The delay buffers BUFa of the same numbers are respectively disposed between the sampling flip-flops 701 through 70j. That is, the voltage measurement signal propagates to the sampling flip-flops 701 through 70j with a constant delay time. The sampling flip-flops 701 through 70j sample respective signals of the delay buffers BUFa on the measurement signal transfer wiring according to the edge of the sampling trigger signal. The outputs of the sampling flip-flops 701 through 70j become output voltage monitor values VM. In the example shown in FIG. 37, the output voltage monitor values VM are the values of j bits.

The offset adjustment unit 73 has table information indicative of a relation between a monitor gain indicative of the amount of fluctuation in the output voltage VM at which the output voltage monitor value VM is changed one for each adjusted number a of first delay adjustment buffers BUFb and second delay adjustment buffers BUFb, and both information about variations in production of semiconductor devices and information about the temperature of a semiconductor substrate. The offset adjustment unit 73 determines the adjusted numbers a of the first delay adjustment buffers BUFb and the second delay adjustment buffers BUFb with reference to the table information in such a manner that the monitor gain determined from the adjusted numbers of first and second delay adjustment buffers, the information about the variations in the manufacture of the semiconductor devices, and the temperature information of the semiconductor substrate falls within a range of target gains set in advance.

The operation of the voltage monitor circuit 11 according to the fourth embodiment will subsequently be described. The voltage monitor circuit 11 adjusts the difference in delay time between the voltage measurement signal and the sampling trigger signal by the difference between the number of the first delay adjustment buffers BUFb of the first delay circuit 71 and the number of the second delay adjustment buffers BUFc of the second delay circuit 72.

In the voltage monitor circuit 11, when the voltage measurement signal is transferred via the delay buffers BUFa and thereafter the sampling trigger signal has reached the sampling flip-flops 701 through 70j, the sampling flip-flops 701 through 70j respectively sample the voltages at their corresponding nodes of the delay buffers BUFa. At this time, when the voltage value of the output voltage VDDM is high, the delay times of the delay buffers BUFa and the delay buffers BUFb become small. Therefore, when the voltage value of the output voltage VDDM is high, the outputs of the more sampling flip-flops 701 through 70j become high in level. On the other hand, when the voltage value of the output voltage VDDM is low, the delay times of the delay buffers BUFa and the delay buffers BUFb become large. Therefore, when the voltage value of the output voltage VDDM is low, the number of the sampling flip-flops 701 through 70j whose outputs become high in level, becomes fewer than when the output voltage VDDM is high.

Here, with the first delay circuit 71, the second delay circuit 72 and the offset adjustment unit 73 being included in the voltage monitor circuit 11 according to the fourth embodiment, the monitor gain can be maintained constant with respect to variations in semiconductor production and variations in the temperature of the semiconductor substrate. Thus, a description will be made of a function for compensating for the variations.

Figure 38:
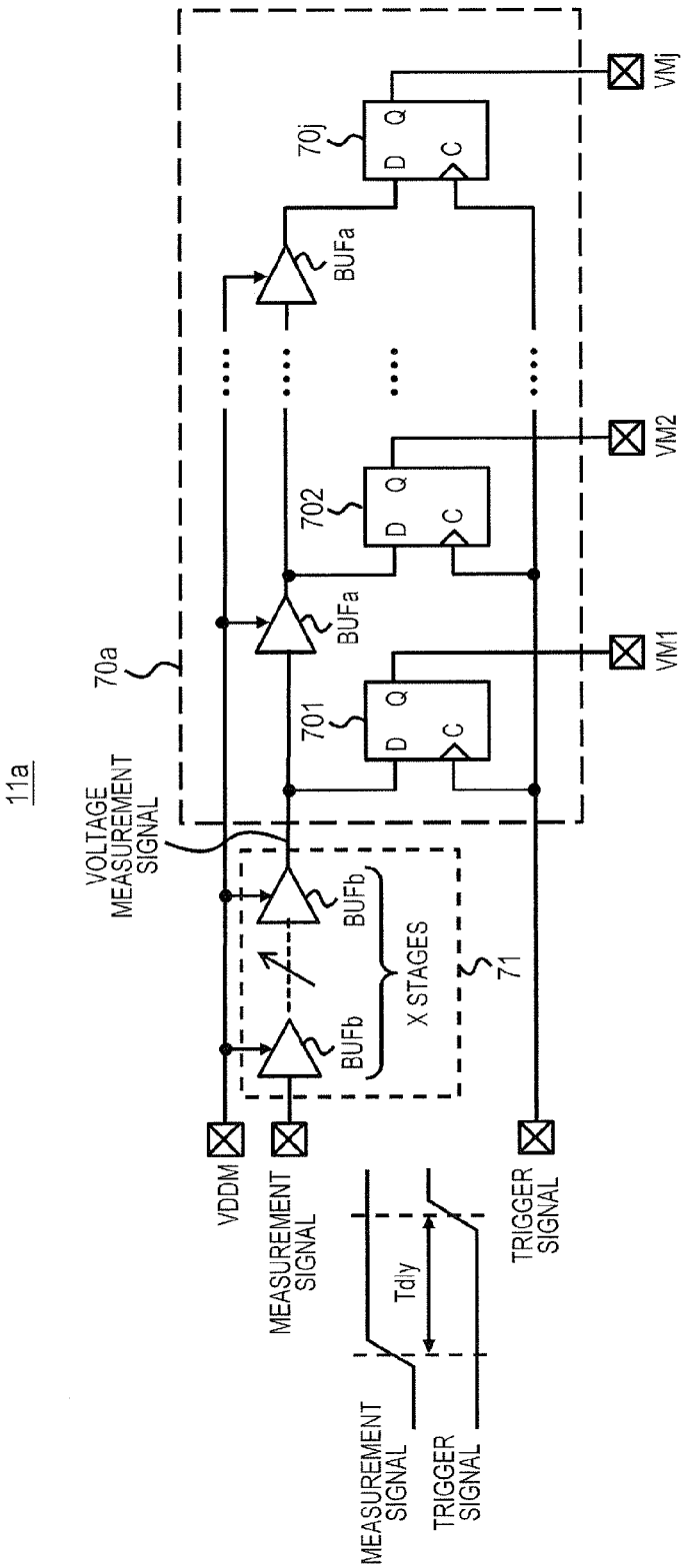
FIG. 38 is a block diagram of a general voltage monitor circuit.

A block diagram of a related art voltage monitor circuit 11a having only a voltage measurement circuit 70 and a first delay circuit 71 is first shown in FIG. 38 as a comparative example. Incidentally, although the voltage measurement circuit is designated at reference numeral 70a to make a distinction from the voltage measurement circuit 70 according to the fourth embodiment, the voltage measurement circuit 70a is substantially identical in circuit configuration to the voltage measurement circuit 70. The first delay circuit 71a has first delay adjustment buffers BUFb of X stages. In the first delay circuit 71a, the number of the delay adjustment buffers BUFb is fixed. As shown in FIG. 38, the voltage monitor circuit 11a is supplied with a measurement signal and a trigger signal from outside. A delay time Tdly between the voltage measurement signal and the trigger signal is set to a constant value regardless of variations in temperature and so on. A relationship between an output voltage of the voltage monitor circuit 11a and its corresponding output voltage monitor value is shown in FIG. 39.

Figure 39:
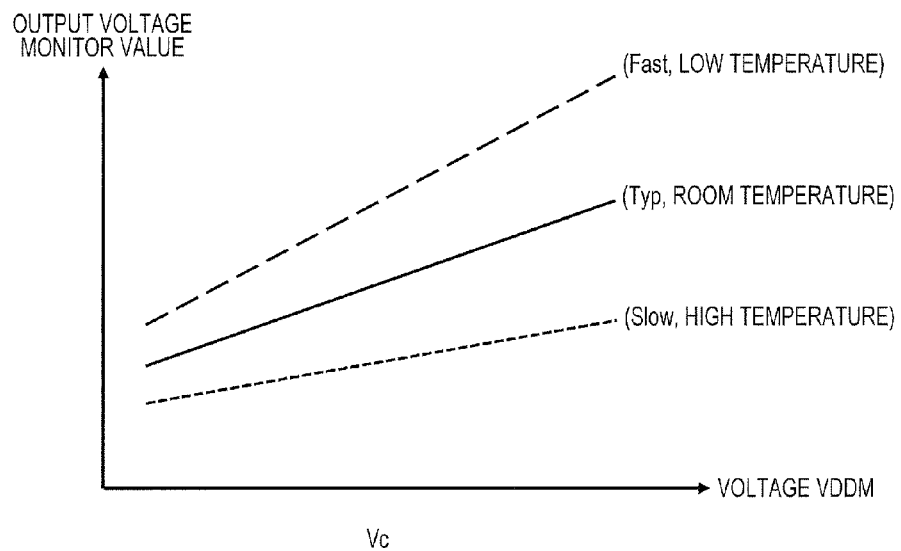
FIG. 39 is a graph showing the relationship between the magnitude of an output voltage and an output voltage monitor value in a general voltage monitor circuit.

In the example shown in FIG. 39, the production variations are shown in three values of Fast, Typ and Slow. Fast indicates that the threshold voltage of a transistor is low and varies, Typ indicates that the threshold voltage thereof is an ideal value, and Slow indicates that the threshold voltage thereof is high and varies. Conditions for temperature are shown in three values of low, room and high temperatures. The low temperature indicates a condition that the temperature of the semiconductor substrate is the minimum operating temperature on the specifications of a semiconductor device. The room temperature indicates a condition that the temperature of the semiconductor substrate is about 25 degrees. The high temperature indicates a condition that the temperature of the semiconductor substrate is the maximum operating temperature on the specifications of the semiconductor device.

First, in the general voltage monitor circuit 11a, the output voltage monitor value thereof VM is expressed in the following equation (7).

$$VM = Tdly/(Tf(pro,volt,temp)) - X \qquad (7),$$

where Tdly indicates a delay time between the voltage measurement signal and the trigger signal, pro indicates the value of variations in manufacture, volt indicates the voltage value of the output voltage VDDM, and temp indicates a temperature condition of the semiconductor substrate. X indicates the number of the first delay adjustment buffers of the first delay circuit 71.

As is understood from the equation (7), in the general voltage monitor circuit 11a, an offset occurs in the output voltage monitor value due to the variations in production. In the general voltage monitor circuit 11a as well, the offset or gradient of the output voltage monitor value VM corresponding to a fluctuation in the substrate temperature varies depending on the variations in production. Therefore, in the voltage monitor circuit 11a as shown in FIG. 39, the characteristics of change in the output voltage monitor value VM relative to the output voltage VDDM have offsets according to the variations in production and the substrate temperature. As shown in FIG. 39, in the voltage monitor circuit 11a, the characteristics of the change in the output voltage monitor value VM relative to the output voltage VDDM have different offsets or gradients according to the variations in production and the substrate temperature.

On the other hand, in the voltage monitor circuit 11 according to the fourth embodiment, the offsets in the characteristics of the change in the output voltage monitor value VM relative to the variations in production and the substrate temperature are canceled out by using the second delay circuit 72. A description will therefore be made below of the principle in which the offsets can be canceled out.

In the voltage monitor circuit 11 according to the fourth embodiment, the output voltage monitor value VM thereof is represented by the following equation (8) where an adjustment to the number of delay adjustment buffers is not performed.

$$VM = Tf(Pro, Vc, temp) \times Z/(Tf(pro, volt, temp)) - X \quad (8),$$

where Vc indicates a constant voltage applied to the second delay adjustment buffers BUFc, and Z indicates the number of the second delay adjustment buffers BUFc of the second delay circuit 72.

Figure 40:
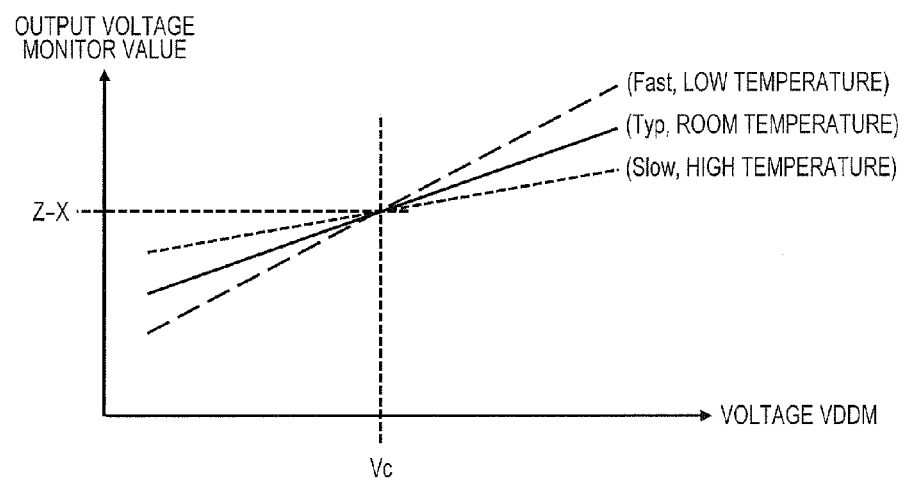
FIG. 40 is a graph showing the relationship between the magnitude of an output voltage and an output voltage monitor value where no offset correction is done in the voltage monitor circuit according to the fourth embodiment.

As is understood from the equation (8), in the voltage monitor circuit 11 according to the fourth embodiment, the output voltage monitor value VM is expressed in Z−X if the output voltage VDDM is the same voltage as the constant voltage Vc. Here, a graph showing the characteristics of change in the output voltage monitor value VM in the state free of execution of the adjustment to the number of the delay adjustment buffers in the voltage monitor circuit 11 according to the fourth embodiment is shown in FIG. 40. As shown in FIG. 40, the voltage monitor circuit 11 according to the fourth embodiment is capable of correcting offsets of the characteristics of change in the output voltage monitor value.

This is because delay times related to variations in production and a substrate temperature are uniformly applied to the voltage measurement signal and the sampling trigger signal by providing the second delay circuit 72, thereby making it possible to cancel out variations related to the variations in production and the substrate temperature during the delay times of the two signals.

In the voltage monitor circuit 11 according to the fourth embodiment, the numbers of the delay adjustment buffers are adjusted in the first delay circuit 71 and the second delay circuit 72 to thereby cancel an error in offset or gradient in the characteristics of change in the output voltage monitor value VM relative to the variations in production and the substrate temperature. Thus, a description will be made below of the principle in which the offset error can be canceled out.

In the voltage monitor circuit 11 according to the fourth embodiment, the output voltage monitor value VM thereof is expressed in the following equation (9).

$$VM = Tf(pro, Vc, temp) \times (Z \pm \alpha)/Tf(pro, volt, temp)) - (X \pm \alpha) \quad (9),$$

where α is a value for an adjustment to each of the numbers of the first delay adjustment buffers BUFb and the second delay adjustment buffers BUFc.

Figure 41:
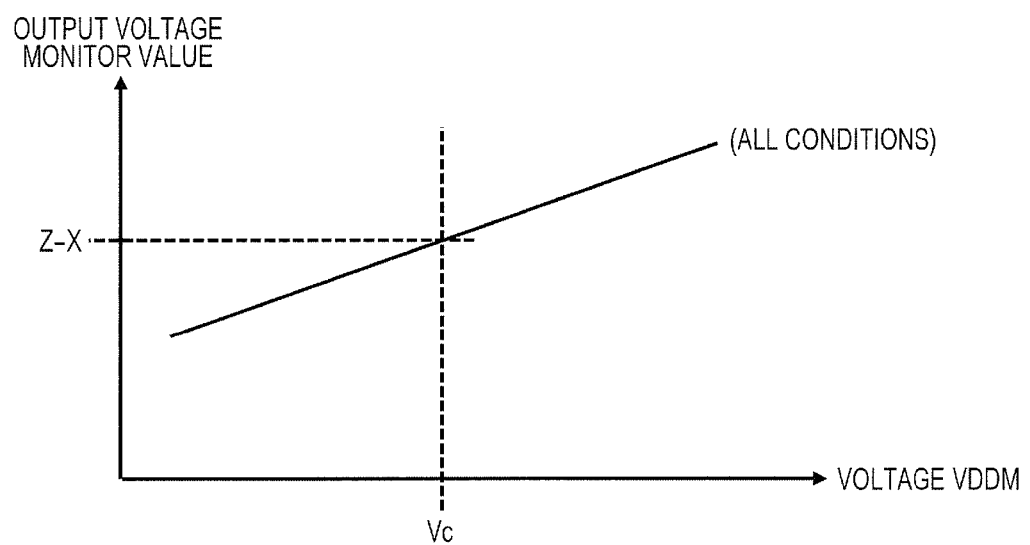
FIG. 41 is a graph showing the relationship between the magnitude of an output voltage and an output voltage monitor value in the voltage monitor circuit according to the fourth embodiment.

As is understood from the equation (9), in the voltage monitor circuit 11 according to the fourth embodiment, the output voltage monitor value VM is expressed in (Z±α)−(X±α) if the output voltage VDDM is the same voltage as the constant voltage Vc. That is, it is understood that this adjustment value α is adjusted according to the substrate temperature to adjust the delay time between the voltage measurement signal and the sampling trigger signal according to the substrate temperature, thereby making it possible to perform a sensitivity adjustment, so that a difference in offset or gradient of the output voltage monitor value VM can be corrected. Here, a graph showing the characteristics of change in the output voltage monitor value VM of the voltage monitor circuit 11 according to the fourth embodiment is shown in FIG. 41. As shown in FIG. 41, in the voltage monitor circuit 11 according to the fourth embodiment, the characteristics of change in the output voltage monitor value are brought to coincidence on all conditions for the variations in production and all conditions for the substrate temperature.

In order to perform the above adjustment, the voltage monitor circuit 11 according to the fourth embodiment has table information. The table information includes a plurality of tables each showing a relationship between a monitor gain indicative of the amount of fluctuation in the output voltage at which the output voltage monitor value VM is changed one, and information about the variations in production of a semiconductor element and temperature information of a semiconductor substrate. One of the tables is associated with one adjustment value α for the number of delay adjustment buffers. Thus, one example of the table information is shown in FIG. 42.

In the example shown in FIG. 42, tables corresponding to number adjustment values α of 5, 8 and 9 are shown as typical examples. As shown in FIG. 42, in each table, three production variation parameters are descried in a vertical axis, and three parameters about substrate temperatures are set to a horizontal axis. A monitor gain of the output voltage monitor value VM where the combination of the respective parameters is made is described in the table.

The offset adjustment unit 73 performs calibration processing on the monitor gain of the voltage monitor circuit 11 by reference to the table information shown in FIG. 42. Thus, a flow chart for the calibration processing is shown in FIG. 43.

Figure 43:
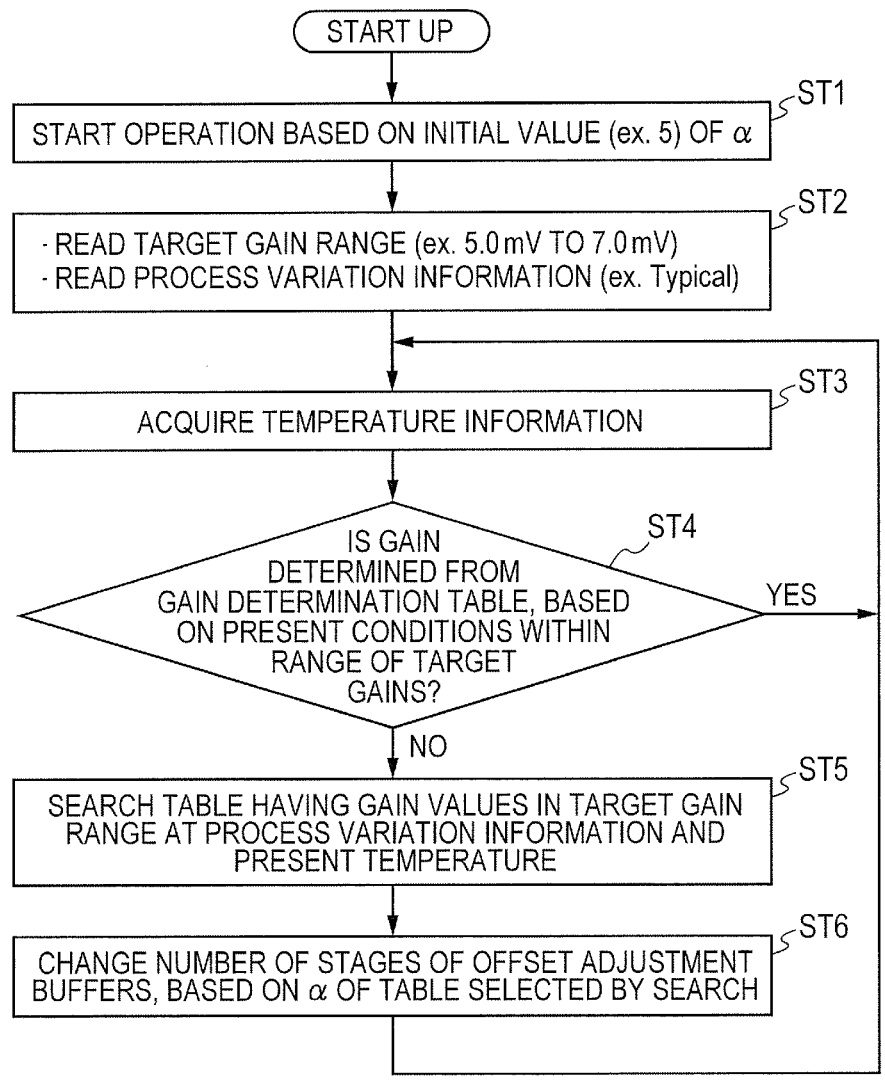
FIG. 43 is a flow chart showing a procedure for a calibration operation of the voltage monitor circuit in the regulator circuit according to the fourth embodiment.

As shown in FIG. 43, when the voltage monitor circuit 11 is started up, the offset adjustment unit 73 first selects a number adjustment value corresponding to an initial value set in advance. The voltage monitor circuit 11 starts operating, based on the number adjustment value (e.g., α=5) (Step ST1).

Subsequently, the offset adjustment unit 73 reads a preset target gain range and process variation information (Step ST2). In the example shown in FIG. 43, 5.0 mV to 7.0 mV are read as the target gain range, and Typical is read as the process variation information.

The offset adjustment unit 73 acquires substrate temperature information from other circuits (Step ST3). Subsequently, the offset adjustment unit 73 confirms a monitor gain at the present moment, based on variation conditions determined by the substrate temperature information and the process variation information at the present moment, and the number adjustment value α selected at the present moment. When the monitor gain at the present moment falls out of the aimed range of target gains (branch of NO at Step ST4), the offset adjustment unit 73 searches for a number adjustment value α capable of achieving a monitor gain assumed to be within the range of target gains under conditions of parameters for production variations and substrate temperature information at the present moment (Step ST5). The offset adjustment unit 73 adjusts the numbers of the delay adjustment buffers of the first delay circuit 71 and the second delay circuit 72, based on the searched number adjustment value α (Step ST6).

On the other hand, when the monitor gain confirmed based on the variation conditions at the present moment and the number adjustment value α selected at the present moment is found to fall within the range of target gains (branch of YES at Step ST4), the offset adjustment unit 73 waits for the input of the next temperature information.

From the above description, in the regulator circuit according to the fourth embodiment, variations in monitor gain caused by fluctuations in variation conditions can be corrected in the voltage monitor circuit 11. Thus, in the regulator circuit according to the fourth embodiment, the monitor gain is maintained constant regardless of the fluctuations in the variation conditions to thereby enable higher-accurate control on the output voltage VDDM.

Incidentally, the present invention is not limited to the above embodiments and can be modified as appropriate within the scope not departing from the gist thereof.

What is claimed is:

1. A semiconductor integrated circuit comprising:
    an output terminal to which a load circuit that consumes a load current is coupled, and from which an output voltage is generated;
    a plurality of output transistors each having one terminal coupled to a power supply terminal and an other terminal coupled to the output terminal, said each output transistor controlling a magnitude of the output voltage corresponding to a magnitude of the load current according to a control value indicated by an impedance control signal supplied to a control terminal thereof;
    a voltage monitor circuit which monitors the output voltage and outputs an output voltage monitor value indicative of a voltage value of the output voltage; and
    a control circuit which controls a magnitude of the control value according to a magnitude of an error value between a reference voltage indicative of a target value of the output voltage and the output voltage monitor value and controls based on the control value whether any of the output transistors is brought into a conducting state,
    wherein the control circuit increases a change step of the control value relative to the error value during a predetermined period according to prenotification signals for notifying a change of the load current in advance.

2. The semiconductor integrated circuit according to claim 1, wherein the control circuit includes a first control value generating unit which generates the control value where the prenotification signal indicates a normal operating period during which a fluctuation in the load current is small, and a second control value generating unit which generates the control value where the prenotification signal indicates a load sudden change period during which a fluctuation in the load current is large.

3. The semiconductor integrated circuit according to claim 2, wherein the first and second control value generating units respectively generate the control values by PID control based on the output voltage and the reference voltage.

4. The semiconductor integrated circuit according to claim 3,
    wherein the second control value generating unit has a second reference voltage larger than a first reference voltage of the first control value generating unit, and a third reference voltage smaller than the first reference voltage, and
    wherein the second control value generating unit performs the PID control based on the second reference voltage where the prenotification signal indicates an increase in the load current.

5. The semiconductor integrated circuit according to claim 3 or 4,
    wherein the first and second control value generating units respectively have gain coefficients each used for the calculation of an integrated value, and
    wherein the second control value generating unit has a second gain coefficient larger than a first gain coefficient of the first control value generating unit.

6. The semiconductor integrated circuit according to claim 3, wherein the second control value generating unit has an offset addition unit which adds in advance, an offset to a temporary control value calculated by an arithmetic operation for the PID control.

7. The semiconductor integrated circuit according to claim 1,
    wherein the output transistors include output transistors provided corresponding to the respective control values, and
    wherein a gate width of each of the output transistors is set so as to increase in a relationship inversely proportional to the magnitude of the control value.

8. The semiconductor integrated circuit according to claim 1 wherein the output transistors include output transistors respectively provided corresponding to the control values, and
    wherein a resistance value of each of the output transistors is set so as to decrease in inverse proportional to the magnitude of the control value.

9. The semiconductor integrated circuit according to claim 1, wherein the output transistors have backgate terminals and drain terminals coupled to one another.

10. The semiconductor integrated circuit according to claim 9,
    wherein the control circuit is operated between a first upper limit voltage and a first lower limit voltage,
    wherein the output transistors have sources to each of which a second upper limit voltage of a voltage value higher than the first upper limit voltage is applied,
    wherein the semiconductor integrated circuit further includes a buffer circuit which is provided between the control circuit and the output transistors and converts an amplitude of the impedance control signal from a first amplitude to a second amplitude higher in upper and lower limit voltages than the first amplitude, and
    wherein the buffer circuit includes a first buffer circuit operated between the first upper limit voltage and the first lower limit voltage, a second buffer circuit operated between the first upper limit voltage and a second lower limit voltage of a voltage higher than the first lower limit voltage, and a third buffer circuit operated between the second upper limit voltage and the second lower limit voltage.

11. The semiconductor integrated circuit according to claim 10,
wherein the buffer circuit has a breakdown-voltage relaxation voltage generating circuit which generates the second lower limit voltage,
wherein the breakdown-voltage relaxation voltage generating circuit has a breakdown-voltage relaxation voltage generating element which is provided between a first node at which the second lower limit voltage is generated, and a second node supplied with the first lower limit voltage and generates the second lower limit voltage, a step-up detection circuit which is operated between the first upper limit voltage and the first lower limit voltage and detects a rise in the second lower limit voltage to thereby bring a voltage suppression signal to an enable state, and a first transistor which is coupled between the first node and the second node and brought to a conducting state where the voltage suppression signal is in the enable state.

12. The semiconductor integrated circuit according to claim 10 or 11,
wherein the semiconductor integrated circuit operates in response to the supply of power supply voltages from a first power supply which generates the first upper limit voltage and a second power supply which generates the second upper limit voltage,
raises the first and second power supplies to the first upper limit voltage,
holds a state of the control value being set to a maximum value as an initial state to start the operation of the control circuit,
transitions the voltage monitor circuit from a halt state to an operating state after the output voltage has reached a start-up voltage set in advance,
raises the voltage generated from the second power supply from the first upper limit voltage to the second upper limit voltage after the voltage monitor circuit has been transitioned to the operating state, and
starts up the load circuit after the control value generated based on the output voltage monitor value obtained from the voltage monitor circuit being in the operating state is brought to a stable state.

13. The semiconductor integrated circuit according to claim 10 or 11,
wherein the semiconductor integrated circuit operates in response to the supply of power supply voltages from a first power supply which generates the first upper limit voltage and a second power supply which generates the second upper limit voltage,
raises the first power supply to the first upper limit voltage,
raises the second power supply to the second upper limit voltage,
holds a state of the control value being set to a minimum value as an initial state to start the operation of the control circuit,
causes the control circuit to gradually increase the control value from the minimum value regardless of the output voltage monitor value,
transitions the voltage monitor circuit from a halt state to an operating state after the output voltage has reached a start-up voltage set in advance, and
starts up the load circuit after the control value generated based on the output voltage monitor value obtained from the voltage monitor circuit being in the operating state is brought to a stable state.

14. The semiconductor integrated circuit according to claim 1,
wherein the voltage monitor circuit includes a first delay circuit which delays a measurement signal indicative of a sampling timing of the output voltage through X (where X: integer) first delay adjustment buffers and outputs a voltage measurement signal therefrom, a measurement signal transfer wiring which transfers the voltage measurement signal through a plurality of delay buffers, a plurality of sampling flip-flops which sample respective signals of the delay buffers on the measurement signal transfer wiring according to an edge of a sampling trigger signal, and a second delay circuit which delays the measurement signal through Z (where Z: integer) second delay adjustment buffers and generates the sampling trigger signal,
wherein the first delay adjustment buffers and the delay buffers respectively vary delay times according to the voltage value of the output voltage,
wherein the second delay adjustment buffers respectively have delay times held constant regardless of the voltage value of the output voltage, and
wherein the numbers of the first and second delay adjustment buffers are increased or decreased by the same number, based on production variation information about each semiconductor device formed over the same substrate and temperature information about a semiconductor substrate.

15. The semiconductor integrated circuit according to claim 14,
wherein the semiconductor integrated circuit has table information indicative of a relationship between a monitor gain indicative of an amount of fluctuation in the output voltage at which the output voltage monitor value is changed one, and the production variation information about the semiconductor device and the temperature information about the semiconductor substrate, and
wherein the semiconductor integrated circuit determines the adjusted numbers of the first and second delay adjustment buffers by reference to the table information in such a manner that the monitor gain determined from the adjusted numbers of the first and second delay adjustment buffers, the production variation information about said each semiconductor device and the temperature information about the semiconductor substrate falls within a range of target gains set in advance.

16. The semiconductor integrated circuit according to claim 15, wherein when the temperature of the semiconductor substrate changes, the semiconductor integrated circuit updates the adjusted numbers of the first and second delay adjustment buffers in such manner that the monitor gain falls within the range of target gains.

* * * * *